United States Patent
Hashemi et al.

(10) Patent No.: US 10,659,091 B2
(45) Date of Patent: May 19, 2020

(54) INTRINSICALLY LINEAR, DIGITAL POWER AMPLIFIER EMPLOYING NONLINEARLY-SIZED RF-DAC, MULTIPHASE DRIVER, AND OVERDRIVE VOLTAGE CONTROL

(71) Applicant: Technische Universiteit Delft, Delft (NL)

(72) Inventors: Mohsen Hashemi, Delft (NL); Leonardus Cornelis Nicolaas de Vreede, Delft (NL)

(73) Assignee: Technische Universiteit Delft, Delft (NL)

( * ) Notice: Subject to any disclaimer, the term of this patent is extended or adjusted under 35 U.S.C. 154(b) by 0 days.

(21) Appl. No.: 16/477,460

(22) PCT Filed: Jan. 12, 2018

(86) PCT No.: PCT/NL2018/050022
§ 371 (c)(1),
(2) Date: Jul. 11, 2019

(87) PCT Pub. No.: WO2018/132006
PCT Pub. Date: Jul. 19, 2018

(65) Prior Publication Data
US 2019/0386690 A1  Dec. 19, 2019

(30) Foreign Application Priority Data
Jan. 13, 2017 (NL) .................................... 2018166

(51) Int. Cl.
*H04B 1/04* (2006.01)
*H03F 1/02* (2006.01)
(Continued)

(52) U.S. Cl.
CPC ......... *H04B 1/0475* (2013.01); *H03F 1/0288* (2013.01); *H03F 1/301* (2013.01);
(Continued)

(58) Field of Classification Search
CPC ..... H04B 1/0475; H03F 1/0288; H03F 1/301; H03F 1/3205; H03F 3/21; H03M 1/66
See application file for complete search history.

(56) References Cited

U.S. PATENT DOCUMENTS

2013/0094611 A1\* 4/2013 Lai .................. H03F 3/2176
375/297

OTHER PUBLICATIONS

International Search Report from priority PCT Appl. No. PCT/NL2018/50022, dated Mar. 7, 2018.

\* cited by examiner

*Primary Examiner* — Nguyen T Vo
(74) *Attorney, Agent, or Firm* — Patent Law Professionals, P.C.; William E. Winters

(57) ABSTRACT

A digitally-controlled power amplifier (DPA) includes a radio frequency digital-to-analog converter (RF-DAC) constructed from nonlinearly weighted PA segments, a multiphase RF drive signal generator that drives the PA segments, and overdrive voltage control circuitry. The nonlinear weighting of the PA segments intrinsically compensates for amplitude-code-word dependent amplitude distortion (ACW-AM distortion) involved in the operation of the RF-DAC and the multiphase RF drive signal generator facilitates ACW-dependent phase distortion (ACW-PM distortion) reduction, thus obviating the need for complicated and efficiency-degrading digital predistortion. The overdrive voltage control circuitry is used to fine tune the RF output of the DPA and compensate for other non-idealities and external influences such as process, voltage, temperature (PVT), frequency and/or load impedance variations.

16 Claims, 21 Drawing Sheets

(51) Int. Cl.
*H03F 1/30* (2006.01)
*H03F 1/32* (2006.01)
*H03F 3/21* (2006.01)
*H03M 1/66* (2006.01)

(52) U.S. Cl.
CPC ............ *H03F 1/3205* (2013.01); *H03F 3/21* (2013.01); *H03M 1/66* (2013.01); *H03F 2200/102* (2013.01); *H03F 2200/447* (2013.01); *H03F 2200/451* (2013.01); *H04B 2001/0425* (2013.01)

| ACW (BINARY) | ACW (THERMOMETER) |
|---|---|
| 000 | 0000000 |
| 001 | 0000001 |
| 010 | 0000011 |
| 011 | 0000111 |
| 100 | 0001111 |
| 101 | 0011111 |
| 110 | 0111111 |
| 111 | 1111111 |

INTRINSICALLY LINEAR, DIGITAL POWER AMPLIFIER EMPLOYING NONLINEARLY-SIZED RF-DAC, MULTIPHASE DRIVER, AND OVERDRIVE VOLTAGE CONTROL

BACKGROUND OF THE INVENTION

Radio frequency (RF) transmitters are used to transmit RF signals over the air, space, or other transmission medium, to an RF receiver. To compensate for the attenuation that the RF signals experience as they propagate to the receiver, RF transmitters include power amplifiers (PAs) that translate the RF signals to higher power, just before they are transmitted.

The PA is usually the component in the RF transmitter that consumes the most power. For this reason, one of the chief goals normally involved in the design of an RF transmitter is to make the PA operate as efficiently as possible. This goal is particularly important in applications where the transmitter's power supply is a battery, such as in a mobile handset, for example, since the PA's power consumption largely determines how long the RF transmitter is able to operate before its battery must be replaced or recharged.

Designing a PA that operates with high efficiency is complicated. It becomes even more complicated in applications where the PA will be presented with a time varying, i.e., "nonconstant" signal envelope. Many modern wireless communications systems employ nonconstant-envelope modulation schemes, which modulate both the amplitude and phase of the transmitter's RF carrier in order to increase spectral efficiency (the rate that information is conveyed over a given bandwidth). Often the modulated carrier will have a high peak-to-average power ratio (PAPR), so special care must be taken in the design of the PA to avoid clipping the signal peaks of these high PAPR signals. The most straightforward approach to avoiding signal peak clipping is to simply back off the output power of the PA from its peak envelope power, by whatever the PAPR happens to be. Unfortunately, that approach reduces the efficiency of the PA, and even substantially so in circumstances where the PAPR is high. For example, in a Class-A PA topology, which only has a theoretical maximum drain efficiency of 50% to begin with, backing of the output power by 6 dB reduces the PA's maximum possible efficiency to less than 30%.

One commonly used approach that avoids having to back off the output power to avoid signal peak clipping and yet still achieves high efficiency is the polar modulator. FIG. 1 is a drawing showing the salient elements of a polar modulator 100. The polar modulator 100 comprises a PA 102, a dynamic power supply (DPS) 104, and an output matching network 106. As its name suggests, the polar modulator 100 operates in the polar domain, using polar-coordinate amplitude modulation (AM) and phase modulation (PM) components. A major benefit that follows from operating in the polar domain is that the PM component has a constant envelope. The constant envelope affords the ability to operate the PA 102 as a switch, i.e., in "switch mode." During operation, the DPS 104 receives the amplitude modulation (AM) component (which is representative of the signal envelope of the nonconstant-envelope RF output RF OUT ultimately produced by the polar modulator 100) and produces a DPS power supply voltage $V_{DD}(t)$ that follows the AM. Meanwhile, a constant-envelope, phase-modulated RF carrier carrying the PM is applied to the RF input port of the PA 102. The phase-modulated RF carrier drives the PA 102, switching it between compressed and cut-off states as the DPS voltage $V_{DD}(t)$ produced by the DPS 104 is applied to the PA's 102's power supply port. One important property of a switch-mode PA is that its output RF power depends on the magnitude of its power supply voltage $V_{DD}$, or, more specifically, on the square of the magnitude of its power supply voltage $V_{DD}^2$. This dependency is exploited in the polar modulator 100 to superimpose the AM contained in the DPS voltage $V_{DD}(t)$ onto the RF output RF OUT as the PA 102 translates the constant-envelope phase-modulated RF carrier to higher RF power.

The output matching network 106 in the polar modulator 100 defines the class of PA (i.e., Class-D, Class-E, etc.) that the polar modulator 100 operates under. In general, the output matching network 106 includes filters that remove unwanted harmonics and that shape the current and voltage waveforms at the output of the PA 102 so they overlap as little as possible, thereby preventing the PA 102 from dissipating wasted power. By operating the PA 102 in switch-mode and carefully designing the output matching network 106, the polar modulator 100 is thus able to achieve very high efficiencies.

Although the polar modulator 100 is able to achieve high efficiencies, its operational capability is constrained by its DPS 104. To maximize efficiency, the polar modulator's DPS 104 is usually implemented using a switch-mode power supply (SMPS). Because the envelope (AM) bandwidth can be very high in modern communications systems, however, the SMPS must be capable of switching at high speeds in order to accurately track the AM. Unfortunately, the power transistors in SMPSs are necessarily large and thus have a limited switching speed capability. Consequently, in circumstances where the DPS 104 is unable to accurately track the AM, significant AM-AM and AM-PM distortion results. Signal envelopes in modern communications applications also tend to have wide voltage dynamic ranges. Designing a DPS that is capable of producing a DPS voltage that covers these wide dynamic voltage ranges can also be difficult, especially when the polar modulator 100 is to be used in situations where the envelope signal bandwidth is high.

Various approaches have been proposed over the years to address the problems that afflict the polar modulator 100 due to its use of the DPS 104. One recently proposed approach that simply eliminates the need for the DPS is the digitally-modulated polar PA, an example of which is described in D. Chowdhury et al., "An Efficient Mixed-Signal 2.4 GHz Polar Power Amplifier in 65-nm CMOS Technology," IEEE J. Solid-State Circuits, vol. 46, pp. 1796-1809, August 2011. FIG. 2 is a drawing of the digitally-modulated polar PA discussed in that paper. The digitally-modulated polar PA 200 is configured to receive an amplitude code word (ACW) that carries the AM in its encoded bit pattern. The encoded ACW is applied to a decoder 202, which responds by decoding the encoded ACW and switching various of the PAs: $PA_1$, $PA_2$, . . . , $PA_N$ into and out of the circuit depending on the logic values of the bits in the decoded ACW. The PAs: $PA_1$, $PA_2$, . . . , $PA_N$ are configured so that the output currents of those PAs that are switched into the circuit sum together. In this way, amplitude modulation is accomplished without the need for a DPS. (Note the PM is conveyed to the RF output RF OUT similar to as in the conventional polar modulator 100 described above.)

The digitally-modulated polar PA 200 enjoys the benefit of not requiring a DPS. However, arguably its best attribute is its all-digital capability. Strictly speaking, the PAs: $PA_1$, $PA_2$, . . . , $PA_N$ are not "digital" devices. However, from the standpoint that the PAs: $PA_1$, $PA_2$, . . . , $PA_N$ operate as switches, which are types of devices that are naturally responsive to digital signals, and given that amplitude modulation is performed under digital control (by enabling and disabling the various PAs: $PA_1, PA_2, \ldots, PA_N$ depending on the value of the digital input ACW), the PAs in the digitally-modulated polar PA 200 are, in effect, digital devices. The all-digital control of the PAs: $PA_1, PA_2, \ldots, PA_N$ affords the ability to manufacture the digitally-modulated polar PA 200, along with all of its control circuitry, in a single low-cost, all-digital complementary metal-oxide-semiconductor (CMOS) integrated circuit (IC) chip or "system on a chip" (SoC).

Although the digitally-modulated polar PA 200 offers the advantages of: 1) not requiring a DPS; 2) all-digital control; and 3) amenability to being fabricated entirely in CMOS technology, it suffers from one serious problem, which is that it is a highly nonlinear device that produces significant amplitude-to-amplitude modulation (AM-AM) and amplitude-to-phase modulation (AM-PM) distortion. AM-AM distortion and AM-PM distortion occurs in the digitally-modulated polar PA 200 due to the fact that its output impedance varies nonlinearly as a function of the input ACW. Consequently, in order for the digitally-modulated polar PA 200 to have any practical use, some sort of linearization must be applied to correct for its nonlinear behavior.

Various linearization techniques have been proposed to address AM-AM and AM-PM distortion in polar PA architectures. The most widely used approach for conventional polar modulators (like the polar modulator 100 described above) is a technique known as digital predistortion (or "DPD"). In DPD, knowledge of the AM-AM and AM-PM distortion curves of the polar modulator 100 gleaned from measurements, modeling, or simulation data. Predistorted AM and PM data that tracks the inverses of the AM-AM and AM-PM distortion curves is then computed and stored in a look-up table (LUT). During operation, the DSP retrieves the predistorted AM and PM data from the LUT, depending on the input AM and in anticipation of the polar modulator's nonlinear AM-AM and AM-PM response. (Alternatively, rather than storing the predistorted AM and PM data in a LUT, the DSP can be configured to compute the AM-dependent predistorted AM and PM data on-the-fly, based on a mathematical.) The predistorted AM and PM data is then translated downstream, through the AM and PM paths of the polar modulator, so that as the PA in the polar modulator amplifies and modulates the predistorted signals the nonlinearities of the polar modulator are compensated for.

In theory, DPD similar to that used in the conventional polar modulator 100 could also be used to correct for AM-AM and AM-PM distortion in the digitally-modulated polar PA 200. However, there would be serious disadvantages and drawbacks with such an approach. First, not only is each of the PAs: $PA_2, \ldots, PA_N$ that make up the digitally-modulated polar PA 200 a nonlinear device, the collective operation of the PAs: $PA_1, PA_2, \ldots, PA_N$ introduces additional nonlinearities that are not easily compensated for using DPD. In other words, the DPD circuitry and methodology needed to linearize the digitally-modulated polar PA 200 would be significantly more complicated than that used to linearize the conventional polar modulator 100. Second, DPD necessarily expands the bandwidths of the AM (ACW) and PM components. Consequently, the expanded bandwidths would require DPD hardware with fast processing speeds, in order to successfully linearize the digitally-modulated polar PA 200. The fast processing speeds would not only make the DPD hardware more difficult to design, it would also increase $CV^2f$ losses, which in turn would significantly lower the overall efficiency of the digitally-modulated polar PA 200. The drawback of the need for fast processing speeds is compounded by the fact that the AM and PM components in polar architectures already by their very nature have wide bandwidths. Hence, while in theory DPD might possibly be used to linearize the digitally-modulated polar PA 200, it would not, at least not by itself, be an optimal solution.

BRIEF SUMMARY OF THE INVENTION

Digitally-controlled power amplifiers (DPAs) and methods of their operation are disclosed. An exemplary DPA includes a radio frequency digital-to-analog converter (RF-DAC) constructed from nonlinearly weighted PA segments, a multiphase RF drive signal generator that drives the PA segments, and overdrive voltage control circuitry. The nonlinear weighting of the PA segments intrinsically compensates for amplitude-code-word dependent amplitude distortion (ACW-AM distortion) involved in the operation of the RF-DAC and the multiphase RF drive signal generator facilitates ACW-dependent phase distortion (ACW-PM distortion) reduction, thus obviating the need for complicated and efficiency-degrading digital predistortion. The overdrive voltage control circuitry is used to fine tune the RF output of the DPA and compensate for other non-idealities and external influences such as process, voltage, temperature (PVT), frequency and/or load impedance variations.

Further features and advantages of the invention, including a detailed description of the above-summarized and other exemplary embodiments of the invention, will now be described in detail with respect to the accompanying drawings, in which like reference numbers are used to indicate identical or functionally similar elements.

DETAILED DESCRIPTION

Figures 3, 4:
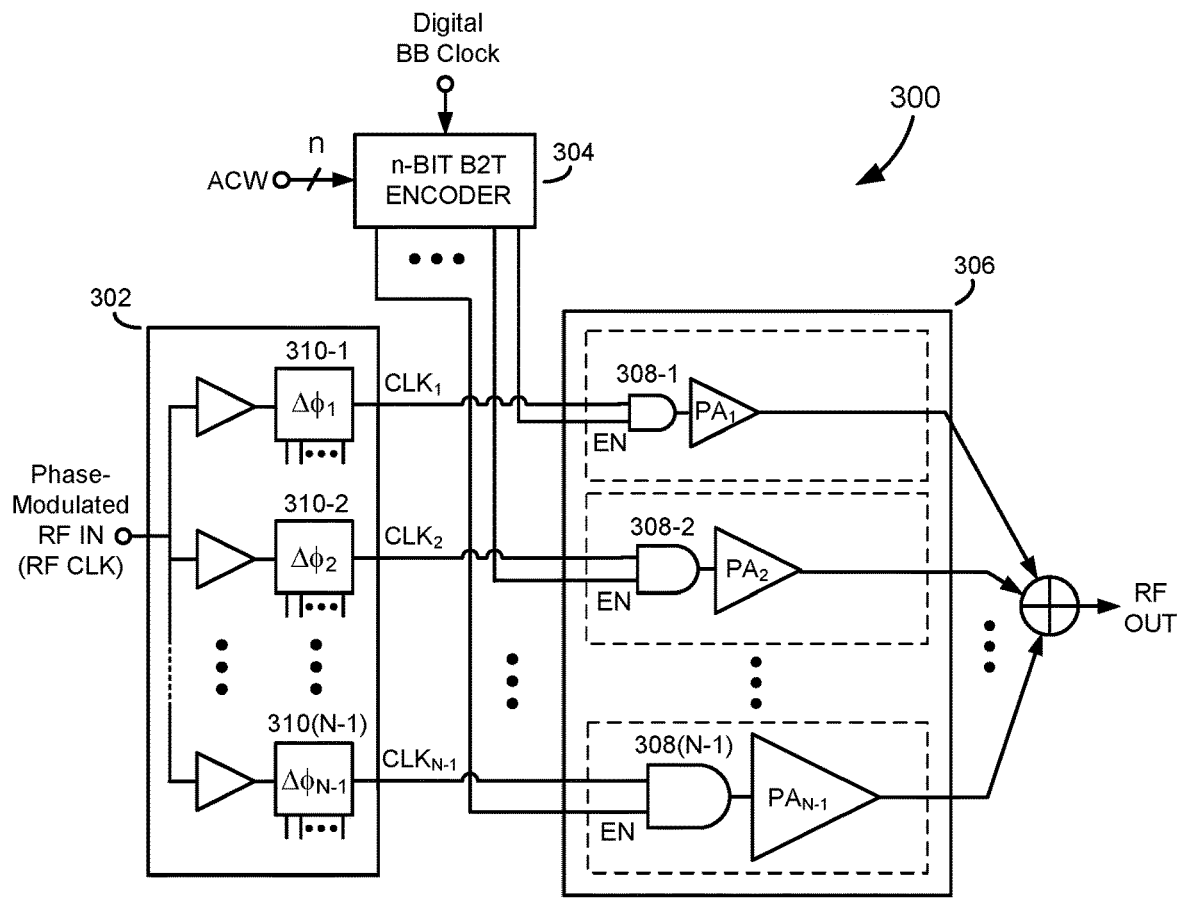
FIG. 3 is a drawing that depicts a digitally-controlled PA (DPA), according to one embodiment of the invention.
FIG. 4 is binary-to-thermometer (B2T) code truth table for a 3-bit B2T encoder.

Referring to FIG. 3, there is shown a digitally-controlled power amplifier (DPA) 300, according to one embodiment of the present invention. The DPA 300 comprises a multiphase radio frequency (RF) clock generator 302; an encoder 304; and a bank of nonlinearly-sized power amplifiers (PAs) 306. Each of the PAs: PA1, PA2, . . . , PAN−1 in the bank of nonlinearly-sized PAs 306 is configured to operate as a switch-mode PA. During operation, the individual PAs are enabled or disabled depending on the bit pattern of a binary-coded input amplitude code word (ACW). The bit pattern of the input ACW changes from cycle to cycle of a baseband clock (BB clock) and is encoded with the amplitude modulation (AM) that is ultimately produced at the RF output of the DPA 300. The individual bits in the input ACW, specifically whether each is a logic "0" or a logic "1," determines which PAs in the bank of nonlinearly sized PAs 306 is/are enabled during each cycle of the BB clock and consequently what the amplitude of the signal envelope of the final RF output RF OUT is. The greater the number of PAs that are enabled, the greater the output amplitude is.

Those PAs in the bank of nonlinearly-sized PAs 306 that have been enabled by the input ACW are driven by a corresponding one of a plurality of RF switch drive signals CLK1, CLK2, . . . CLKN−1 provided by the multiphase RF clock generator 302. Depending on the particular modulation scheme being employed, the RF switch drive signals CLK1, CLK2, . . . CLKN−1 may or may not be phase-modulated. (The reason for using a plurality of RF switch drive signals to drive the PAs: PA1, PA2, . . . , PAN−1, instead of just one, will be explained below.) In the exemplary DPA 300 described here, the RF switch drive signals CLK1, CLK2, ... CLKN−1 are phase modulated, each containing the same phase modulation (PM) that is contained in the phase-modulated input RF IN (RF CLK). Accordingly, PM is conveyed to the RF output RF OUT by the switch-mode action of those PAs that have been enabled by the input ACW. From the foregoing description it should be clear that the bank of nonlinearly-sized PAs 306 actually operates as a digital-to-analog converter (DAC) or, more specifically, as a DAC that operates at RF, directly converting the AM represented in the digital input ACW into the analog signal envelope of the final phase-modulated RF output RF OUT. By virtue of this property, the bank of nonlinearly-sized PAs 306 is referred to in the description that follows as an "RF-DAC."

The transistors used to implement the PAs: PA1, PA2, ..., PAN−1 in the RF-DAC 306 are preferably field-effect transistors (FETs). However, bipolar junction transistors (BJTs) of different sizes could be alternatively used. When implemented using FETs, those PAs that are enabled are connected in parallel so that the gate widths of their FETs sum together to increase the overall effective gate width Weff of the DPA 300. The ON resistance RDS(ON) of a FET is inversely proportional to its gate width W. Accordingly, as the AM represented in the input ACW increases, the effective ON resistance RDS,eff(ON) of the DPA 300 decreases. This dependence of the effective ON resistance RDS,eff(ON) on the input ACW thus provides a means for conveying the AM that is coded in the input ACW into the RF output RF OUT.

Figure 5:
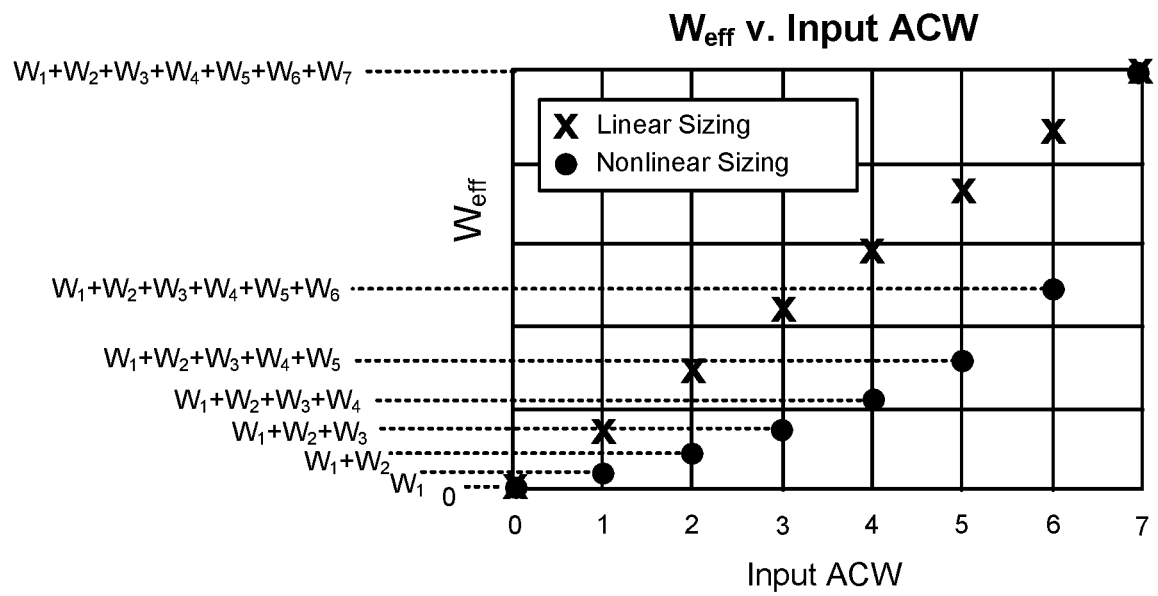
FIG. 5 is a graph that compares the effective gate width Weff of the DPA depicted in FIG. 3, which is constructed from nonlinearly-sized power transistors, to the effective gate width Weff of a DPA constructed from linearly-sized power transistors.
Figure 6:
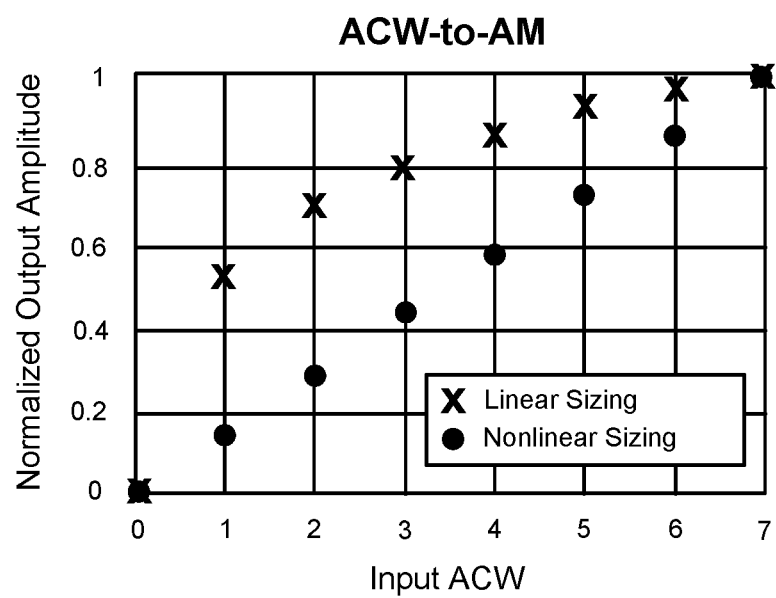
FIG. 6 is a graph showing that the nonlinear-sized power transistors used in the RF-DAC in the DPA depicted in FIG. 3 results in a linear ACW-AM curve.

The PAs PA1, PA2, ..., PAN−1 not only provide a means for performing amplitude modulation, in accordance with one embodiment of the invention the gate widths W1, W2, ..., WN−1 of the FET from which the PAs are built are nonlinearly sized with respect to one another. In the context of the present invention the term "nonlinearly sized" means that the gate widths W1, W2, ..., WN−1 are relatively sized so that the effective gate width Weff of the DPA 300 (i.e., the sum of the gate widths of all FETs of the PAs: PA1, PA2, ..., PAN−1 that are enabled at any given time) is not a linear function of the input ACW. The nonlinear sizing takes into account the fact that both the effective ON resistance RDS,eff(ON) of the RF-DAC 306 and the amplitude of its RF output are both nonlinear functions of the input ACW. By carefully sizing the widths W1, W2, ..., WN−1 of the FETs to counter these nonlinearities, the output amplitude of the DPA 300 is made to be a linear function of the input ACW, i.e., the RF-DAC 306 is linearized. This nonlinear sizing of the effective gate width Weff as a function of the input ACW is shown in the graph in FIG. 5, and the linearized output that results is shown in the graph in FIG. 6. The graph in FIG. 6 also compares the linearized output of the RF-DAC 306 to the ACW-AM curve of a prior art linearly-sized DPA. As can be seen, a linear-sized DPA results in a nonlinear output amplitude versus input ACW curve. Consequently, DPD or some other type of predistortion must be applied in order to compensate for the ACW-AM distortion in the prior art DPA. It should be mentioned that while the main reason for nonlinearly sizing the gate widths W1, W2, ..., WN−1 of the FETs is to compensate for the ACW-dependent nonlinear relationships between RDS(ON) and Weff and the nonlinear relationship between RDS(ON) and the RF output power, their nonlinear sizing can also take into account the gain compression that the individual PAs: PA1, PA2, ..., PAN−1 exhibit when switched into compression.

In the exemplary DPA 300 depicted in FIG. 3, the encoder 304 comprises an n-bit binary-to-thermometer encoder (B2T) 304 and the nonlinearly-sized PAs: PA1, PA2, ..., PAN−1 are enabled and disabled in response to the bits in a thermometer-coded ACW provided by the B2T encoder 304. In general, an n-bit B2T encoder produces N=2n unique codes, each having 2n−1 bits, and is able to resolve 2n different levels. The number of logic "1" in each thermometer code corresponds to the decimal equivalent of the binary code from which it is encoded. For example, as illustrated in the B2T truth table in FIG. 4, which is for an n=3-bit B2T encoder, a binary code of 101 (decimal equivalent 5) results in a 7-bit thermometer code of 0011111, which has 5 logic "1 s." Accordingly, if the encoder 304 in the DPA 300 happened to be a 3-bit B2T encoder, a thermometer code of 0011111 would enable, via the AND gates 308-1, 308-2, ..., 308-(n−1), the first five PAs: PA1, PA2, PA3, PA4 and PA5, and leave the two largest PAs: PA6 and PA7 disabled.

It should be emphasized that thermometer coding is not a necessary feature of the present invention. For example, the encoder 304 could be implemented in other ways other than B2T and the PAs: PA1, PA2, ..., PAN−1 could be sized in other ways that are correlative to other encoding schemes. From the standpoint of the invention, the important point is that the PAs: PA1, PA2, ..., PAN−1 are nonlinearly sized and switched into and out of the circuit in a way that linearizes the ACW-AM curve of the DPA.

Figure 1:
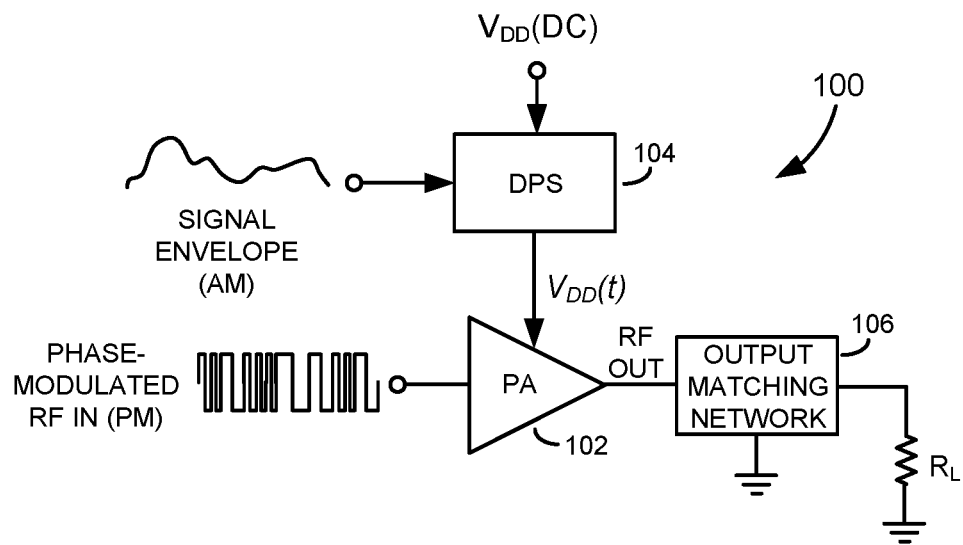
FIG. 1 is a simplified drawing showing the main elements of a conventional polar modulator.
Figure 2:
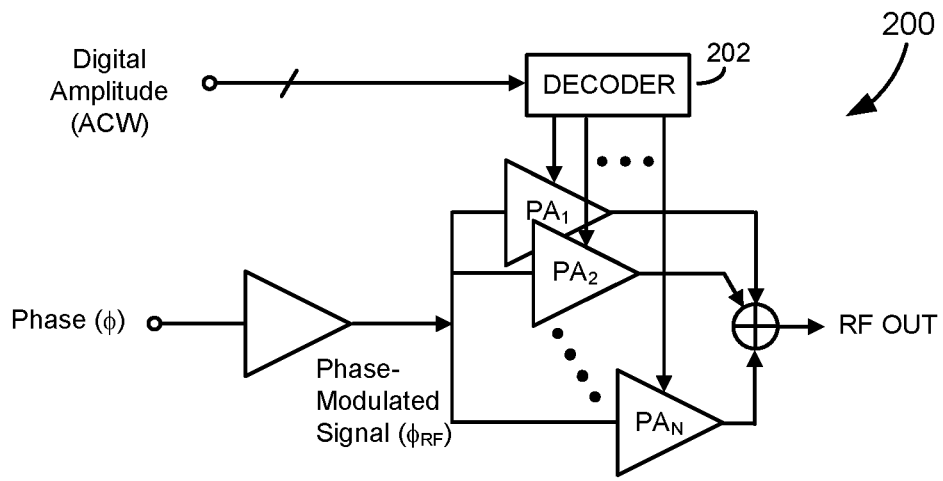
FIG. 2 is a drawing that depicts a prior art digitally-controlled polar power amplifier (PA)
Figure 7:
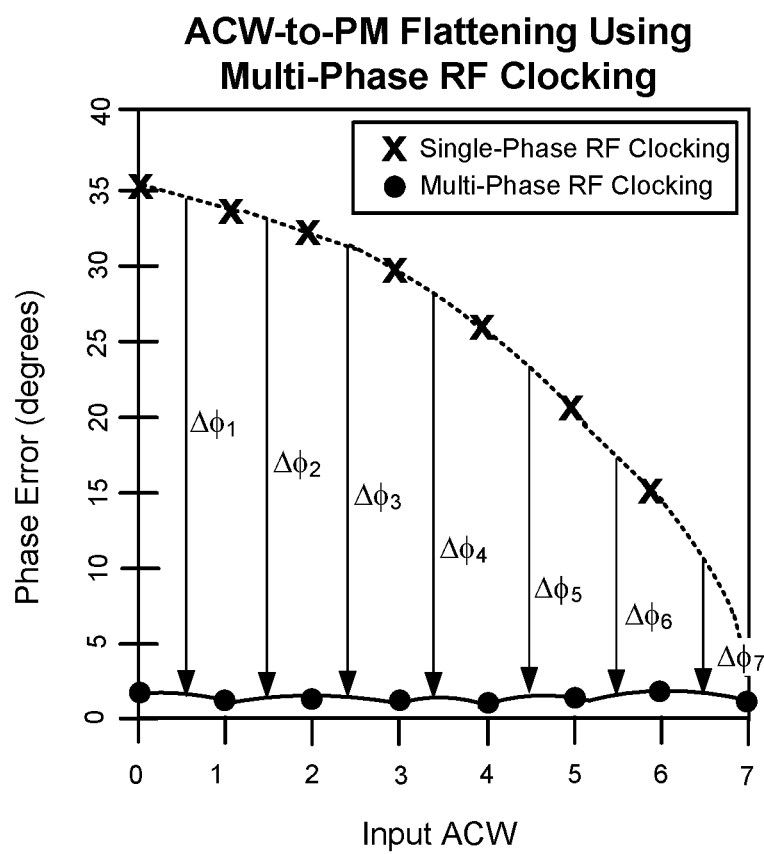
FIG. 7 is a graph showing how the multiphase RF clocking employed in the DPA depicted in FIG. 4 flattens the DPA's ACW-PM curve and consequently reduces phase error in the DPA's RF output.

According to another aspect of the invention, the PAs that make up the RF-DAC 306 are switched ON and OFF by a plurality of RF switch drive signals CLK1, CLK2, CLK3 or what may be referred to as a plurality of "multiphase RF clocks CLK1, CLK2, ..., CLKN−1," rather than by a common RF switch drive signals as in prior art digitally-controlled polar PAs like that depicted in FIG. 2 above. (Note that in the exemplary DPA 300 depicted in FIG. 3, the multiphase RF clocks CLK1, CLK2, ..., CLKN−1 are gated through the enabling/disabling AND gates 308-1, 308-2, ... 308(N−1) so that only those AND gates that receive a logic "1" from the thermometer-coded ACW allow the corresponding ones of the multiphase RF clocks CLK1, CLK2, ..., CLKN−1 to pass through and drive their respective PAs.) The reason for using the multiphase clocks CLK1, CLK2, ..., CLKN−1 to drive the PAs: PA1, PA2, ..., PAN−1 is to reduce ACW-dependent phase error that would otherwise occur in the RF output RF OUT of the DPA 300. In the absence of the multiphase RF clocking aspect of the present invention, the DPA 300 would produce substantial ACW-dependent phase error in its RF output RF OUT. This ACW-dependent phase error results from the fact that the RF-DAC is 306 is inherently nonlinear. Specifically, both the RF output power of the DPA 300 output signal and its related RF phase have nonlinear relationships with the ACW-dependent effective ON resistance RDS,eff(ON), which is in turn inversely proportional to the effective gate width or ACW. The ACW-dependent phase error is shown in FIG. 7, which plots the phase error of the RF output RF OUT of the DPA 300 as a function of the input ACW. As can be seen, the phase error tends to be highest when the input ACW is lowest. The multiphase RF clock generator 302, specifically its programmable delay lines 310-1, 310-2, ..., 310(N−1), serves to correct this ACW-dependent phase error (i.e., ACW-PM distortion) by delaying the RF clocks it generates and applies to the smaller PAs more than the RF clocks it generates and applies to the larger PAs. When translated to the phase domain, and as also can be seen in FIG. 7, this relative delaying of the RF clocks CLK1, CLK2, ..., CLKN−1 results in a flattening of the phase error for all values of the input ACW. Note that in this particular embodiment of the invention the delay/phase-offsets of the RF clocks CLK1, CLK2, ..., CLKN−1 remain fixed during normal operation of the DPA 300, i.e., do not changed dynamically. In other embodiments of the invention, the delay/phase-offsets of the RF clocks CLK1, CLK2, ..., CLKN−1 are dynamically adjusted to correct for AM-AM and AM-PM distortion caused by changes in the DPA's load impedance, which can occur, for example, in MIMO (multiple-input and multiple output) applications and mobile handsets that suffer from changing antenna impedances.

All of the various components that make up the DPA 300 are either digitally implemented or digitally controlled. The binary-to-thermometer encoder 304 and the AND logic gates 308-1, 308-2, ..., 308(N−1) used to enable and disable the various PAs: PA1, PA2, ..., PAN−1 are digital circuits. Additionally, the programmable delay lines 310-1, 310-2, ..., 310(N−1) that make up the multiphase RF clock generator 302 can be digitally implemented. Finally, because the PAs: PA1, PA2, ..., PAN−1 operate as switches, the bank of nonlinearly-sized PAs 306 is naturally suited for digital control. This all-digital capability of the DPA 300 is very appealing since it lends itself to being manufactured in a single all-digital integrated circuit or 'system on a chip' (SoC). Although some prior art DPAs can also be manufactured as a SoC, a major benefit of the DPA of the present invention is that the nonlinearly-sizing of the PAs: PA1, PA2, ..., PAN−1 intrinsically compensates for ACW-AM distortion and the multiphase RF clocking scheme accounts for ACW-PM distortion. Consequently, no DPD is needed. This DPD-less capability also results in a smaller die size, lower power dissipation, and higher efficiency.

Figure 8:
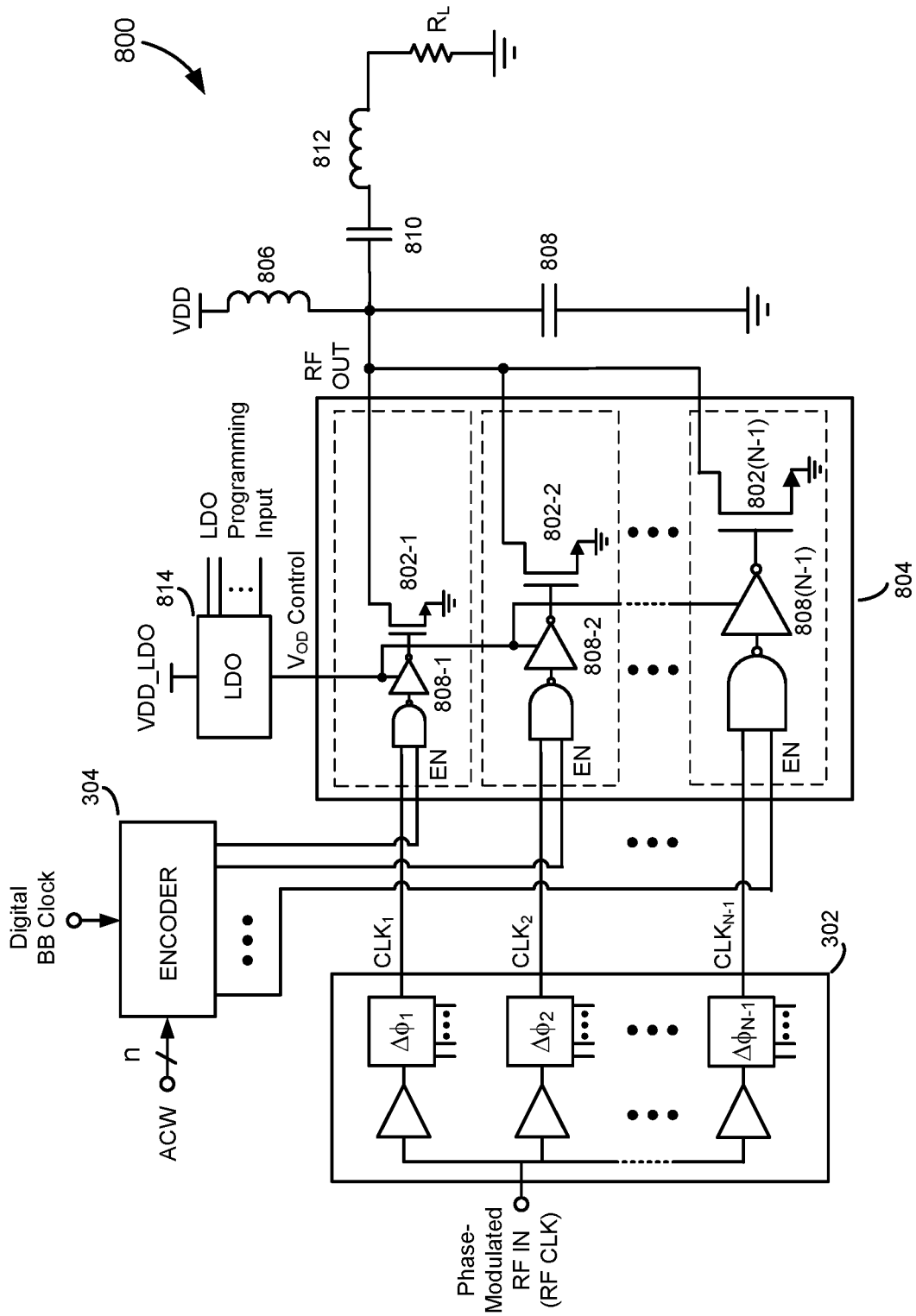
FIG. 8 is a drawing that depicts a DPA, according to another embodiment of the present invention.

The DPA 300 depicted in FIG. 3 can be adapted to operate according to any type or class of switch-mode PA, including Class-D, inverse Class-D (also referred to as Class-D−1 or current-mode Class-D), Class-E, and Class-F switch-mode PAs. FIG. 8 shows, for example, a DPA 800 that is configured for Class-E operation, in accordance with one embodiment of the invention. Similar to as in the DPA 300, logic gates (in this example the series-connected NAND and inverter gates) are employed to selectively gate multiphase RF clocks CLK1, CLK2, ..., CLKN−1 to the RF inputs of FETs 802-1, 802-2, ..., 802(N−1) of an RF-DAC 804, depending on the baseband cycle-to-cycle bit pattern of the thermometer-coded input ACW. Multiphase RF clocks CLK1, CLK2, ..., CLKN−1 are also used to switch those FETs in the RF-DAC 804 that have been enabled and to carry the PM contained in the original input phase-modulated RF clock RF CLK to the RF output. (Note that passive components 806-812 in the drawing in FIG. 8 form the output matching network of this Class-E implementation, as will be appreciated and understood by those of ordinary skill in the art.) The thermometer-coded ACW produced by the n-bit B2T encoder 304 directly and digitally determines what the effective gate width of the Class-E PA is at any given time. Those FETs 802-1, 802-2, ..., 802(N−1) that are enabled at any given time share the same drain connection (i.e., are connected in parallel) and consequently determine the overall effective gate width Weff, drain current, and output amplitude of the Class-E PA at that particular time.

The FETs: 802-1, 802-2, ..., 802(N−1) in the RF-DAC 804 are also nonlinearly-sized to avoid ACW-AM distortion at the RF output. In a preferred embodiment of the invention the nonlinear-sizing of the FETs: 802-1, 802-2, ..., 802(N−1) is accomplished by nonlinearly sizing their gate widths W1, W2, ..., WN−1 during fabrication, based on known, measured, estimated, or modeled AM-AM characteristics of the FETs. By nonlinearly sizing the gate widths W1, W2, ..., WN−1 so that they counter the inherent nonlinearities of the RF-DAC (e.g., the ACW-dependent nonlinear relationships between RDS(ON) and Weff and the nonlinear relationship between RDS(ON) and the RF output power), the output amplitude of the DPA 800 is then made to be a linear function of the input ACW. It should be mentioned that the nonlinear sizing of the FETs: 802-1, 802-2, ..., 802(N−1) could be alternatively accomplished by nonlinearly sizing the gate lengths L1, L2, ..., LN−1 of the FETs: 802-1, 802-2, ..., 802(N−1) or by nonlinearly sizing both the gate widths W1, W2, ..., WN−1 and gate lengths L1, L2, ..., LN−1. While neither of those alternatives is disclaimed, most semiconductor manufacturing processes restrict all FETs in the IC to having the same gate length. For this reason, in the preferred embodiment of the invention, nonlinear sizing is accomplished by a nonlinear sizing of the gate widths W1, W2, ..., WN−1 alone.

The Class-E DPA 800 depicted in FIG. 8 further includes a programmable low-dropout (LDO) regulator 814. The LDO regulator 814 is used to compensate for process, voltage, temperature (PVT), load and/or frequency variations (because the output amplitude/power also depends on the load impedance seen by the drain of the output transistors). The ON resistance RDS(ON) of a FET is inversely proportional to the FET's gate width. Additionally, because FETs in switch-mode PAs are switched ON in the triode region of their I-V characteristic curves, their ON resistance RDS(ON) when switched ON also depends on the voltage applied to their gates. More specifically, the ON resistance RDS(ON) decreases with increasing gate voltage VG, i.e., RDS(ON)∝1/VG. The LDO regulator 814 in the DPA 800 exploits this dependency of RDS(ON) on gate voltage VG to compensate for PVT variations. Specifically, the LDO regulator 814 is programmed to generate a DC supply voltage, which when applied to inverters/buffers 808-1, 808-2, ..., 808(N−1) slightly increases or decreases overdrive voltages VOD they produce in excess of their threshold voltages VT, i.e., VOD=VGS−VT. By controlling the overdrive voltages to the FETs in the RF-DAC 804, the output amplitude of the DPA's 800's RF output RF OUT can thus be tuned and PVT/load/frequency variations can be compensated for. (Note that an LDO regulator that serves this same PVT/load compensation purpose can also be beneficially incorporated in any of the other embodiments of the invention described herein.)

In the exemplary DPA 800, the output amplitude resolution is coarse, unless the number of FETs in the RF-DAC 804 is increased. While increasing the number of FETs would increase the resolution it would require a large number of differently-sized FETs, which is undesirable since mismatches among the various sizes could adversely affect the accuracy of the RF-DAC 804. One way that the amplitude resolution of the RF-DAC can be increased without having to increase the number of sizes of FETs is to configure the FETs in an array and apportion the most significant bits (MSBs) and least significant bits (LSBs) of the input ACW between two encoders—a row encoder and a column encoder. That approach is used in the DPA 900 depicted in FIG. 9, which is a DPA according to another embodiment of the invention. The RF-DAC 904 is an N×M array, where N and M are positive integers representing the number of rows and number of columns, respectively, in the array. Each of the N rows includes what will be referred to herein as a "PA segment," and each PA segment includes M FETs (or "unit cells"). The DPA 900 further includes an n-bit B2T row encoder 906 that receives the n upper MSBs of the input ACW and an m-bit B2T column encoder 908 that receives the lower LSBs of the input ACW, thereby providing the RF-DAC 904 the ability to resolve M×N=2n×2m amplitude levels at its output. Note that whereas the RF-DAC 904 has the ability to resolve M×N=2n×2m amplitude levels, only 2n different sizes of FETs is required. To realize the same number of amplitude levels in the fully thermometer-coded RF-DAC 804 in the DPA 800 depicted in FIG. 8, the 2n×2m (a factor 2m times more) FETs would be necessary.

Figure 9:
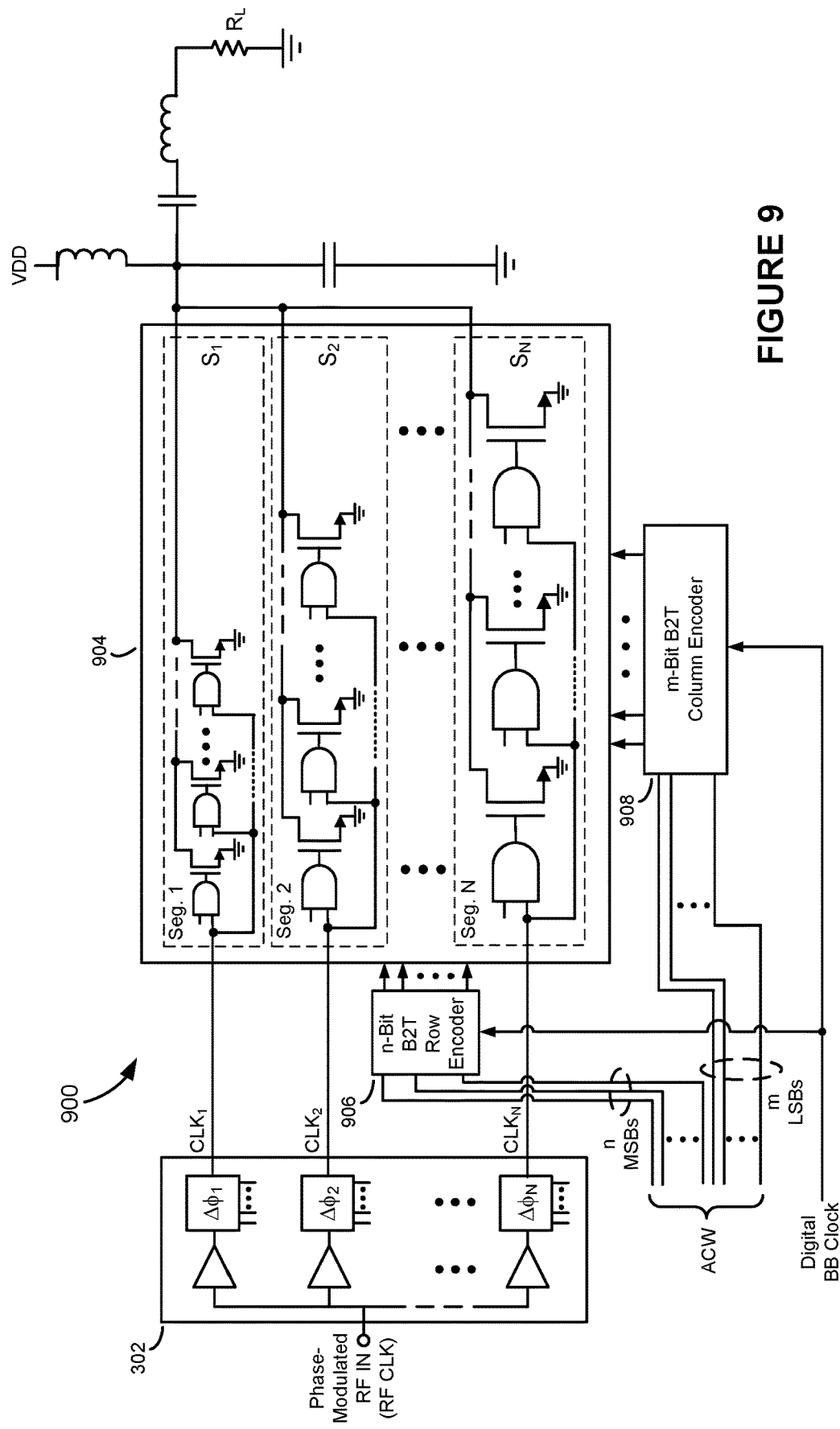
FIG. 9 is a drawing that depicts a DPA, according to another embodiment of the present invention.

The PA segments Seg. 1, Seg. 2, . . . , Seg. N are nonlinearly weighted with respect to one another so that sizes of the FETs from one PA segment to another are nonlinearly sized and so that the effective gate width Weff of the DPA 900 (i.e., the sum of the widths of all enabled FETs at any given time) is not a linear function of the input ACW and the resulting ACW-AM curve of the DPA 900 is substantially linear for all values of the input ACW. Note that the nonlinear weighting of the PA segments Seg. 1, Seg. 2, . . . , Seg. N is indicated in FIG. 9 using the symbols S1, S2, . . . , SN.

During operation, the n-bit B2T row encoder 906 determines how many of the N PA segments Seg. 1, Seg. 2, . . . , Seg N is/are selected, depending on the row thermometer code it generates from the binary-coded upper n MSBs of the input ACW. Rows are selected progressively, starting with the least-weighted segment (i.e., starting with Seg. 1). Once the row thermometer code increases to a value that results in a particular PA segment being selected, all FETs in that PA segment are enabled and remain enabled until the row thermometer code reduces to a number that deselects the PA segment. Additionally, all FETs in PA segments of lesser weight remain enabled. The m-bit B2T column encoder 908 determines how many of the M unit cells in the next most heavily weighted PA segment are enabled. As an example, consider a 7-bit RF-DAC where n=3 and m=4 (8 rows and 16 columns). With a binary-coded input ACW of 1011001, the B2T row encoder 906 would produce a row thermometer code of 00011111 (5 logic "1s") that select the first 5 PA segments in the RF-DAC 902, resulting in all FETs in the first 5 PA segments: Seg. 1, Seg. 2, Seg. 2, Seg. 3, Seg. 4, and Seg.5 being enabled, and the B2T column encoder 908 would produce a column thermometer code of 0000000111111111 (9 logic "1 s") that enables 9 of the FETs in the 6th PA segment (Seg. 6). All of the FETs in the two remaining and most heavily-weighted PA segments, Seg. 7 and Seg. 8, remain disabled, unless and until the input ACW increase to a value high enough to enable them.

Figure 10:
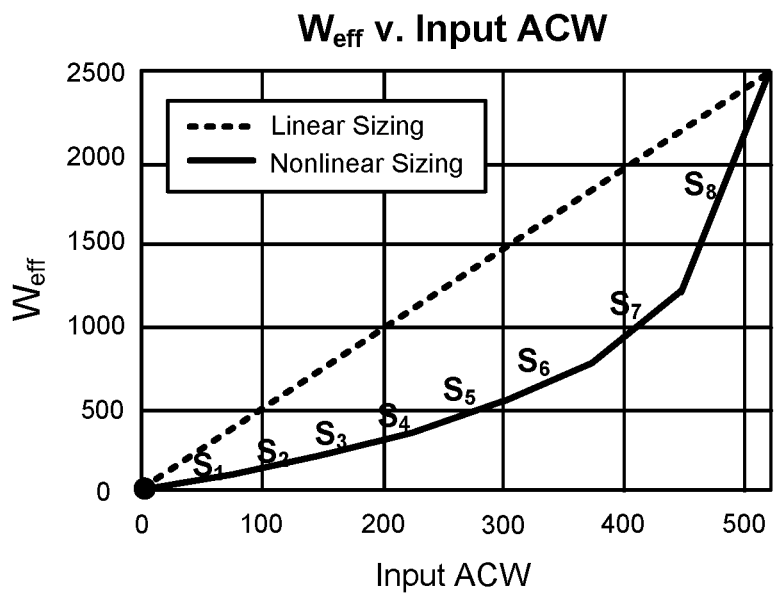
FIG. 10 is a graph that compares the effective gate width Weff of the DPA depicted in FIG. 9, which is constructed from nonlinearly-weighted PA segments, to the effective gate width Weff of a DPA constructed from linearly-weighted PA segments.
Figure 11:
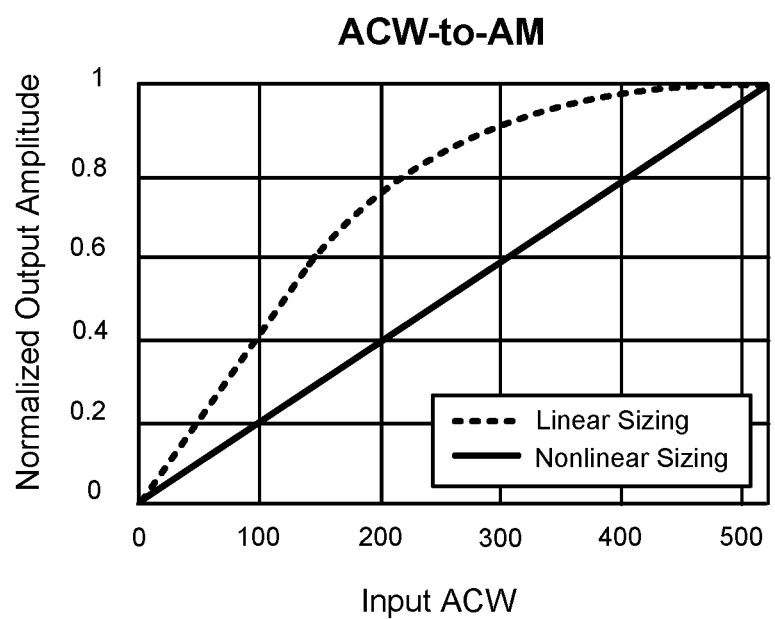
FIG. 11 is a graph showing that the nonlinear-sized power transistors of the RF-DAC used in the RF-DAC of the DPA depicted in FIG. 3 result in a linearized ACW-AM curve.

FIGS. 10 and 11 are graphs that illustrate how the nonlinear weighting of the PA segments Seg. 1, Seg. 2, . . . , Seg. N in the DPA's 900's RF-DAC 904 results in a linear ACW-AM curve. In this example, the RF-DAC 904 is a 9-bit RF-DAC having N=2n=23=8 rows and M=2m=26 columns. The 9-bit RF-DAC is therefore capable of resolving 29=512 amplitude levels. FIG. 10 shows the effective gate width Weff as a function of the input ACW. The effective gate width Weff is seen to increase linearly within a given PA segment (since in this particular embodiment of the invention the FETs in each PA segment have the same size and are enabled/disabled using thermometer code) but overall the effective gate width Weff is a nonlinear function of the input ACW. FIG. 11 compares the ACW-AM curve of a linear-sized DPA to the ACW-AM curve of the DPA 900. The two graphs reveal that by carefully setting the nonlinear weights S1, S2, . . . , S8 of the PA segments Seg. 1, Seg. 2, . . . , Seg. 8 based on the inverse of the ACW-AM curve of a linear-sized DPA, the ACW-AM curve of the DPA 900 is linearized.

Figure 12:
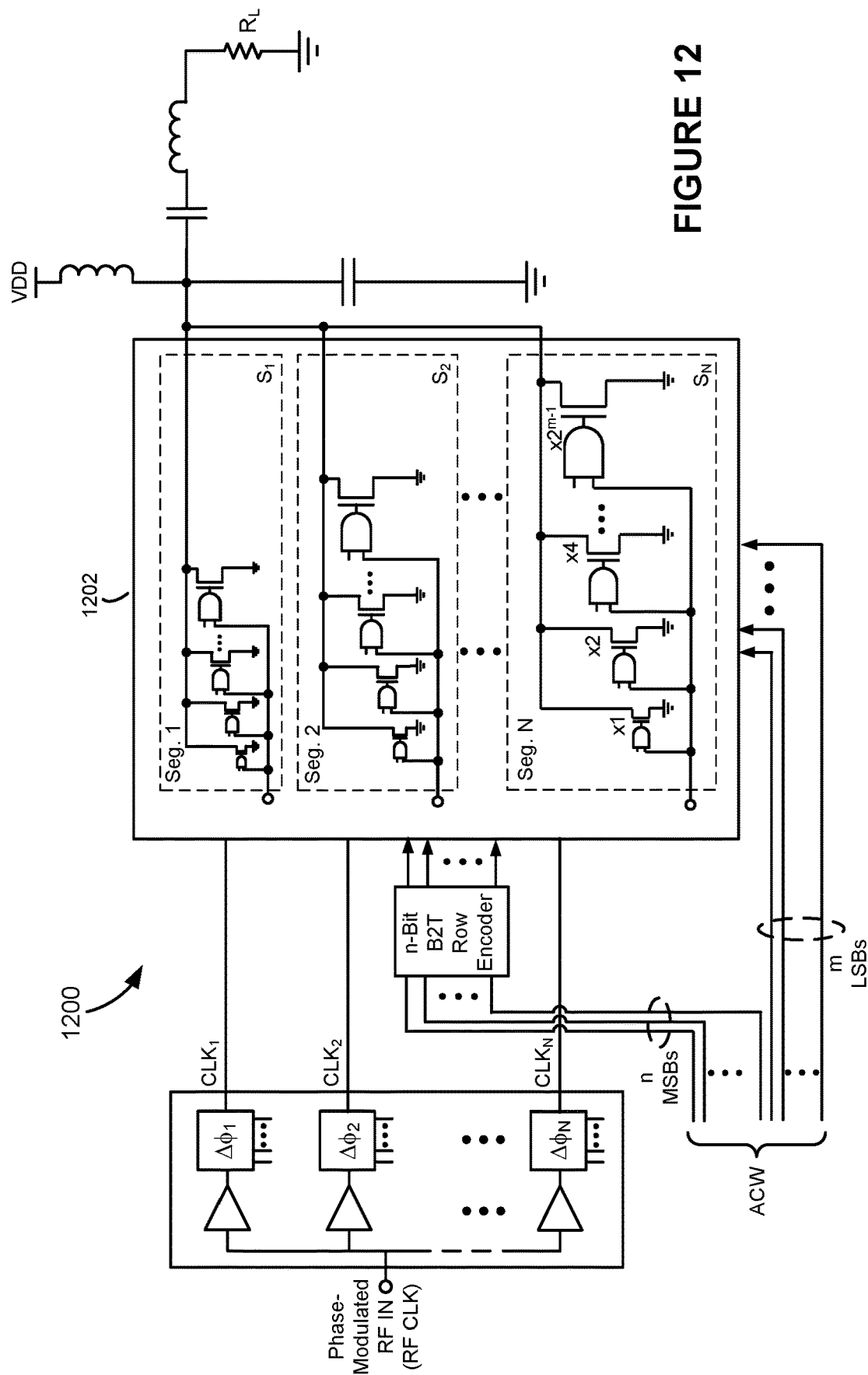
FIG. 12 is a drawing that depicts a DPA, according to another embodiment of the present invention.

The FETs in each PA segment of the RF-DAC 904 in the exemplary DPA 900 have the same size (i.e., same gate width) and the PA segments are nonlinearly weighted with respect to one another. That it is not a necessary condition, insofar as the invention is concerned. The only requirement is that the sizes of the FETs (unit cells) in the RF-DAC and the encoding scheme used to enable and disable the unit cells result in the effective gate width Weff varying nonlinearly as a function of the input ACW so that the DPA is able to produce a linear ACW-to-AM profile. FIG. 12 illustrates, for example, a DPA 1200 having an RF-DAC 1202 that employs a plurality of nonlinearly weighted S1, S2, . . . , SN PA segments, each having binary-weighted unit cells. Like the DPA 900, the effective gate width Weff of the DPA 1200 still increases linearly within a given PA segment (since the FETs in each PA segment are enabled and disabled directly by the binary-coded m LSBs of the input ACW). However, when considering the RF-DAC 1202 as a whole, the effective gate width Weff is a nonlinear function of the input ACW and so that DPA 1200 is able to produce a linear ACW-to-AM profile.

Figure 13:
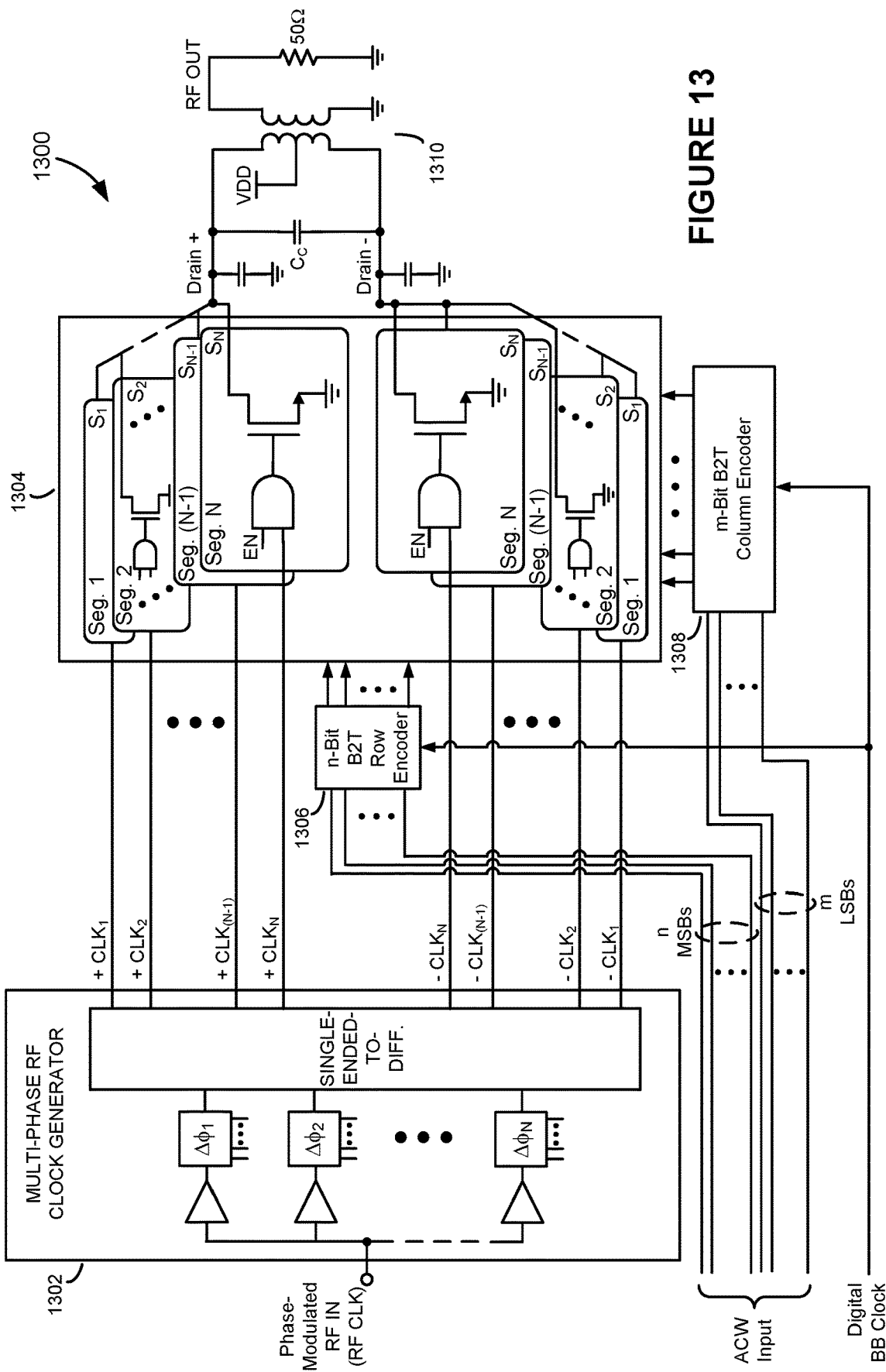
FIG. 13 is a drawing that depicts a DPA, according to another embodiment of the present invention.

Because the voltage levels present in integrated circuits manufactured from state-of-the-art CMOS technology are only on the order of 1 volt, it is desirable in some applications to adapt the DPAs described above for differential operation. FIG. 13 is a drawing of a DPA 1300 having a differential architecture, according to one embodiment of the invention. The DPA 1300 comprises a multiphase RF clock generator 1302; a differential RF-DAC 1304; an n-bit B2T row encoder 1306; an m-bit B2T column encoder 1308; and an output transformer 1310. The multiphase RF clock generator 1302, n-bit B2T row encoder 1306, and m-bit B2T column encoder 1308 operate similar to the multiphase RF clock generator 302, n-bit B2T row encoder 906, and m-bit B2T column encoder 908 of the DPA 900 describe above (see FIG. 9 and accompanying description), except differentially, so a description of their operation will not be repeated here. The output transformer 1310 provides impedance matching to the load RL and also converts the differential output of the RF-DAC 1304 to a single-ended output that interfaces to the antenna or load RL, which is typically 50Ω. The center tap of the primary winding of the transformer also serves the dual purpose of providing an AC ground for the fundamental component of the RF output and a terminal through which the drain power supply voltage VDD can be fed to the FETs in the RF-DAC 1304.

Figure 14:
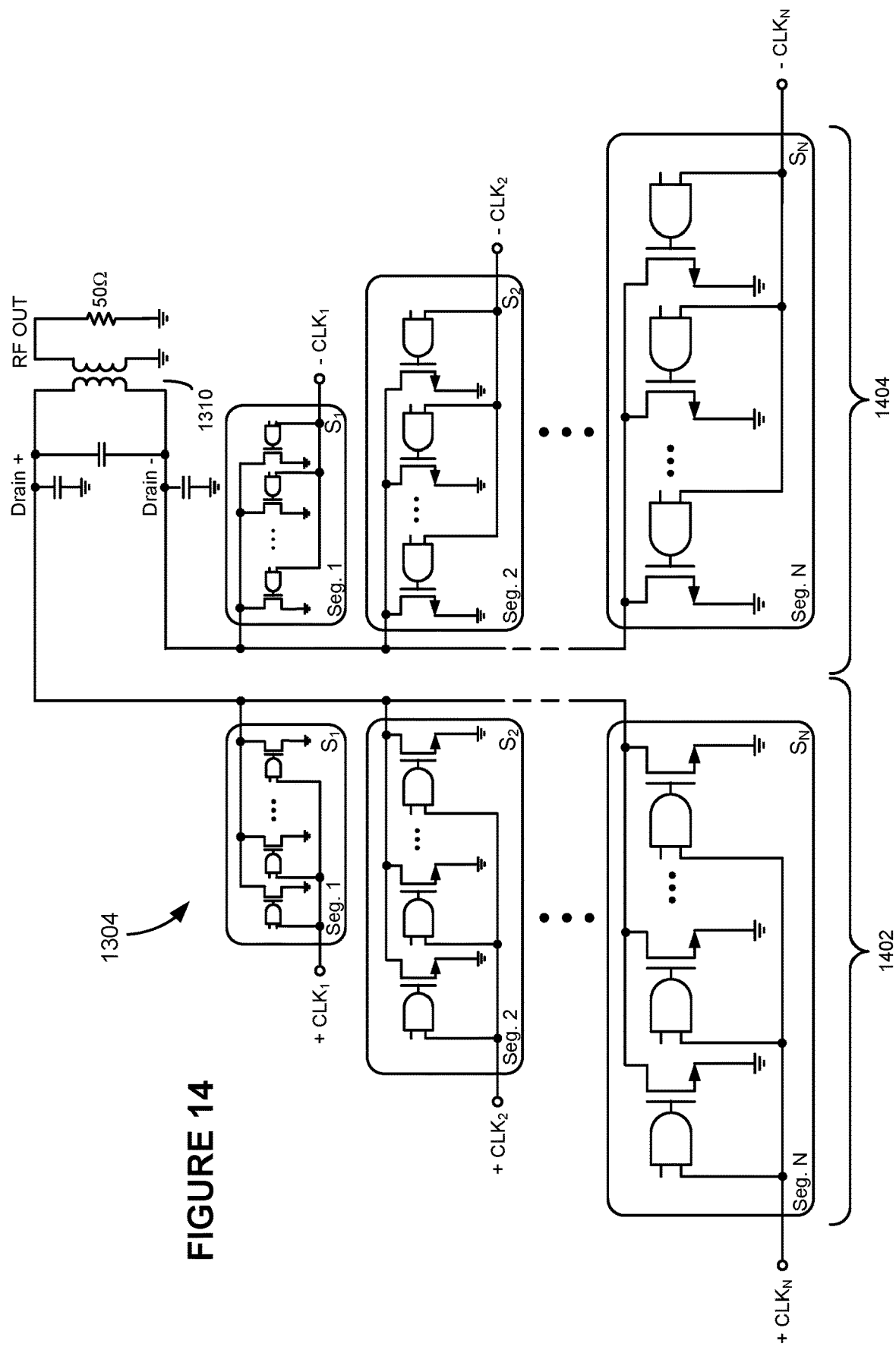
FIG. 14 is a drawing illustrating one way that the differential RF-DAC in the DPA depicted in FIG. 13 can be implemented, in accordance with one embodiment of the present invention.

FIG. 14 is a more detailed drawing of the RF-DAC 1304 and output transformer 1310 used in the construction of the DPA 1300. As can be seen, the RF-DAC 1304 includes two halves 1402 and 1404 of PA segments, each half being essentially identical to the RF-DAC 904 used in the DPA 900 depicted in FIG. 9.

Figure 15:
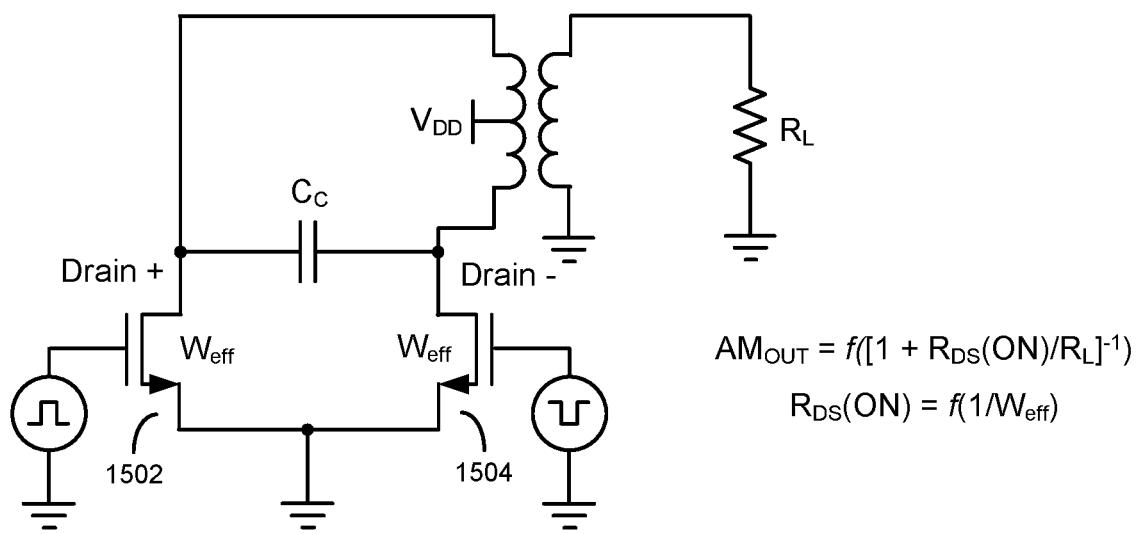
FIG. 15 is a schematic diagram of the equivalent circuit that results from the combination of the RF-DAC and output transformer of the DPA depicted in FIG. 14, showing how the equivalent circuit is analogous to an inverse Class D (i.e., Class D-1) PA.

FIG. 15 is a schematic diagram of the equivalent circuit of the RF-DAC 1304 and output transformer 1310. The circuit is analogous to a type of switch-mode PA known in the amplifier arts as a "Class D-1" PA (or "inverse Class D" PA), except for the fact that the gate widths of the two FETs 1502 and 1504 vary over time. The two FETs 1502 and 1504 in the schematic correspond to the two halves 1402 and 1404 of PA segments of the RF-DAC 1304 (see FIG. 14) and their effective gates width Weff, which is the same for both FETs, is determined by how many unit cells in the RF-DAC are enabled, which in turn is determined by the time-varying value of the input ACW. The two FETs 1502 and 1504 are driven out of phase, so that when one FET is switched OFF the other FET is switched ON. This results in the current in the circuit being steered from one branch to the other, and the drain currents in both paths having a square waveform. The tank circuit formed by the parallel combination of the primary winding of the output transformer 1310 and the capacitor CC is designed to resonate at the desired fundamental frequency, thereby producing a sinusoidal output voltage across the Drain+ and Drain− output terminals. Since the magnitude of the drain current through each of the FETs 1502 and 1504 when switched ON is directly proportional to its effective gate width Weff, the output current changes as the input ACW changes and the resulting amplitude of the signal envelope of the final RF output is modulated accordingly. One benefit of Class D-1 operation (and a benefit that Class-E operation also enjoys) is that it operates with zero voltage switching (ZVS). ZVS means that when either one of the FETs 1502 and 1504 is switched ON, the voltage across the FET is zero. Consequently, the FET's parasitic drain-source capacitance does not discharge through the FET. In other words, ZVS avoids the parasitic drain-source capacitance having to charge and discharge from cycle to cycle. This ZVS property is particularly beneficial when the DPA 1300 is manufactured in CMOS technology since it reduces CV2f losses.

It should be mentioned that the capacitance of the coupling capacitor CC in the DPA 1300 can also be tuned to enhance the efficiency of the DPS 1300. When the multiphase RF clocking is used to drive the RF-DAC 1304, it can (depending on the device technology and the class of the amplifier this may or may not happen) result in a degradation in the drain efficiency when the DPA 1300 is operating at full power and PA segments are being selected or deselected. Without the coupling capacitor present CC present, as the FETs in the larger PA segments are switched OFF and their drain voltage begins to rise, some of the smaller PA segments that are still ON would sink the drain current and consequently dissipate power, thus lowering the peak efficiency of the DPA 1300. By including an appropriately valued coupling capacitor CC across the Drain+ and Drain− terminals, however, some of this current is bypassed through the coupling capacitor CC, so it is not dissipated as heat and efficiency is thereby improved. Note that when the coupling capacitor CC is tuned in this manner, the shapes of the drain current and drain voltage waveforms are changed slightly and in way that makes them look more like those exhibited in Class-E/F2 operation.

Figure 16:
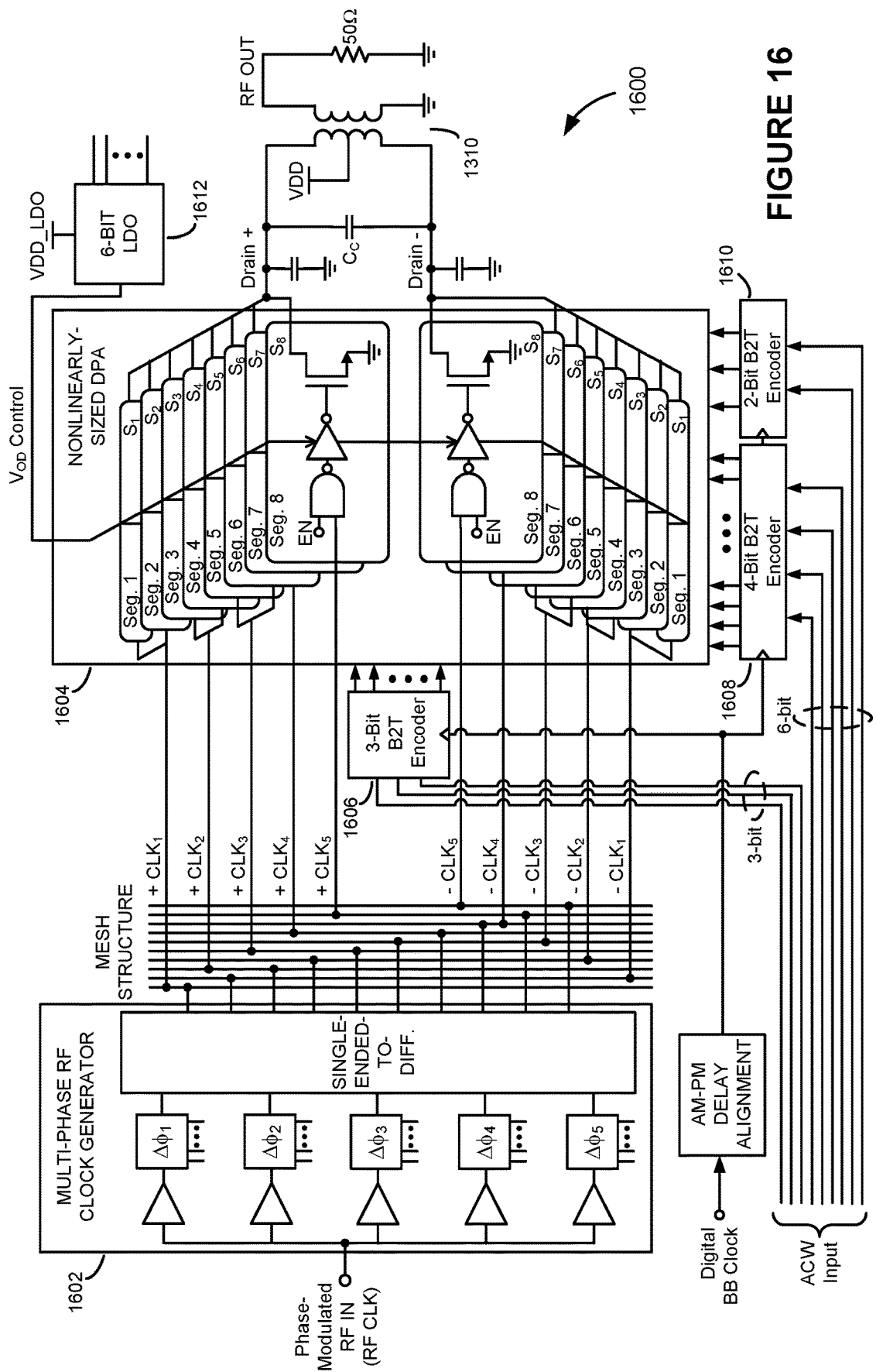
FIG. 16 is a drawing showing the salient elements of a DPA constructed according to the DPA approach depicted in FIG. 13.

FIG. 16 is a drawing showing the salient elements of an actual DPA 1600 constructed according to the DPA approach described and shown above in reference to FIG. 13. The entire DPA 1600 is fabricated in a single IC chip using a 40 nm deep-submicron CMOS process. The RF-DAC 1604 is differentially implemented, similar to how the RF-DAC 1304 depicted in FIG. 14 is differentially implemented, and each half of the RF-DAC 1604 includes M=2n=23=8 rows of PA segments. The PA segments are nonlinearly weighted. Specifically, as indicated in FIG. 16, the eight nonlinearly weighted PA segments Seg. 1, Seg. 2, . . . , Seg. 8 in each half of the RF-DAC 1604 have nonlinear weights: S1, S2, S3, S4, S5, S6, S7, and S8. Further, each of the PA segments Seg. 1, Seg. 2, . . . , Seg. 8 includes 16 thermometer coded unit cells and 3 smaller (by a factor of 4) thermometer coded unit cells. Selecting and deselecting the PA segments is controlled by a 3-bit B2T row encoder 1606, which is responsive to the n=3 MSBs of the input ACW. Enabling and disabling the unit cells within the PA segments is performed by a first m1=4-bit B2T column encoder 1608, which is responsive to the upper four of the six LSBs in the input ACW and a second m2=2-bit column B2T encoder 1610, which is responsive to the final two LSBs. The RF-DAC 1604 is therefore capable of resolving 2n×2m=2n×2m1× 2m2=23×26=29=512 levels (0-511) at its output. By apportioning the encoding responsibility between the 4-bit B2T and 2-bit column B2T encoders 1608 and 1610 the complexity of the encoding logic is significantly reduced and the number of unit cells per PA segment can be reduced from 64 per row (which would be needed if only a single 6-bit column encoder was used) down to 19 per row (16 normal-sized units cells plus 3 smaller (by a factor of 4) unit cells), without lowering the resolution.

Figure 17:
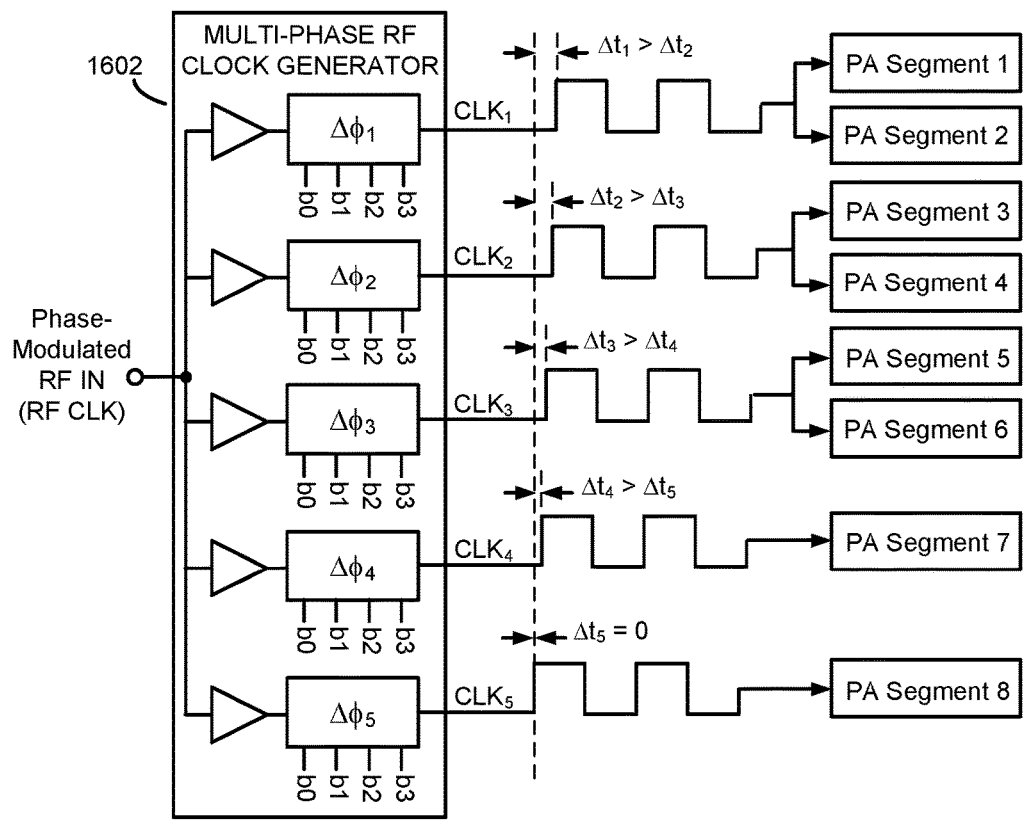
FIG. 17 is a more detailed depiction of the multiphase RF clock generator used in the DPA depicted in FIG. 16.
Figure 18:
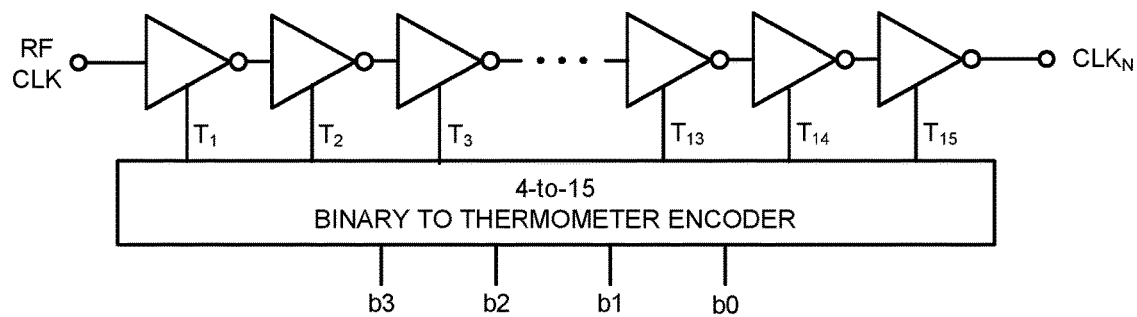
FIG. 18 is a drawing that illustrates how the phase shifters in the multiphase RF clock generator depicted in FIG. 17 can be implemented using programmable delay lines formed from chains of inverters.
Figure 19:
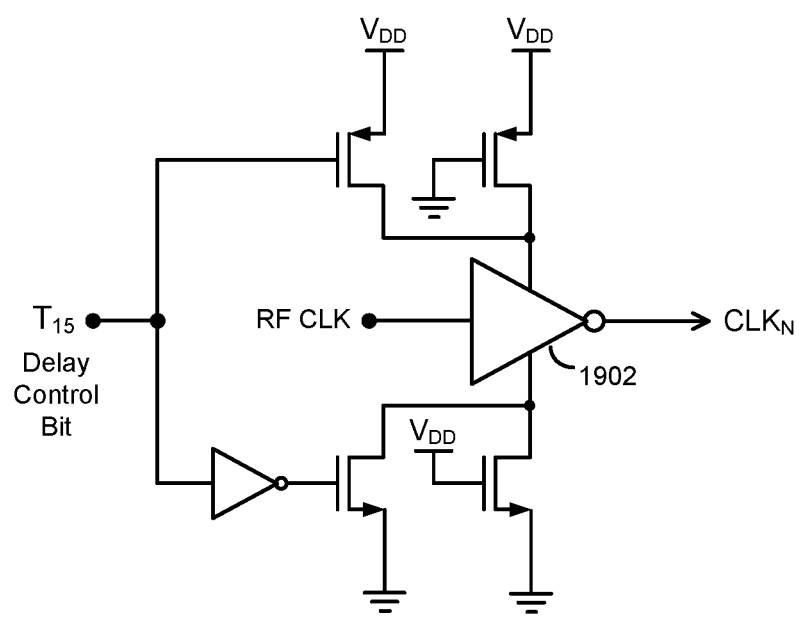
FIG. 19 is a schematic diagram illustrating one way that each of the inverters in the chain of inverters shown in FIG. 18 can be implemented.

The DPA 1600 further includes a multiphase RF clock generator 1602, which contains five phase shifters $\Delta\phi 1$, $\Delta\phi 2$, $\Delta\phi 3$, $\Delta\phi 4$, and $\Delta\phi 5$ and a single-ended to differential converter, which produces at its output five differential phase-modulated RF clocks +CLK1/−CLK1, +CLK2/−CLK2, +CLK3/−CLK3, +CLK4/−CLK4, and +CLK5/−CLK5. Note that the phase shifters $\Delta\phi 1$, $\Delta\phi 2$, $\Delta\phi 3$, $\Delta\phi 4$, and $\Delta\phi 5$ that make up the multiphase RF clock generator 1602 can be implemented in a various ways. In the exemplary DPA 1600 described here, they are implemented using programmable delay lines formed by chains of inverters, as illustrated in FIG. 18. (Note that each inverter in the inverter chain is not necessarily a simple inverter. In one embodiment of the invention, each inverter in the delay chain is modified, as illustrated in FIG. 19, to provide a relative delay of +5 ps or −5 ps, each of which is 3-4 times smaller than the absolute delay of the simple inverter 1902.) The five differential clocks+CLK1/−CLK1, +CLK2/−CLK2, +CLK3/−CLK3, +CLK4/−CLK4, and +CLK5/−CLK5 contain the same PM that is contained in the original phase-modulated RF input RF IN (RF CLK) and are selectively gated to the rows of PA segments, via series-connected NAND and inverter gates, depending on the thermometer code produced by the B2T row encoder 1606. The passive mesh network is used to equalize the delays of all RF clocks from the output of the multiphase RF clock generator 1602 to the inputs of the PA segments Seg. 1, Seg., 2, . . . , Seg. 8. The differential phase-modulated RF clocks+CLK1/−CLK1, +CLK2/−CLK2, . . . , CLK5/−CLK5 are controlled so that they have different phase offsets and in this particular exemplary embodiment of the invention, and as can be more clearly observed in FIG. 17, Seg. 1 and Seg. 2 are driven by the same differential RF clock +CLK1/−CLK1, Seg. 3 and Seg. 4 are driven by the same differential RF clock +CLK2/−CLK2, and Seg. 5 and Seg. 6 are driven by the same differential RF clock +CLK3/−CLK3. Driving the PA segments with the multiphase RF clocks reduces ACW-dependent phase error at the output of the DPA 1600 and flattens the DPA's 1600 ACW-PM curve, similar to as described above in reference to FIG. 7, thereby obviating the need for DPD to correct for the phase error. In effect, the output currents of the enabled PA segments sum so that the overall output phase is inherently averaged. The programmable phase shifters $\Delta\phi 1$, $\Delta\phi 2$, $\Delta\phi 3$, $\Delta\phi 4$, and $\Delta\phi 5$ thus provide a controllable and considerable reduction in ACW-dependent phase error, particularly at lower ACW levels.

Figure 20:
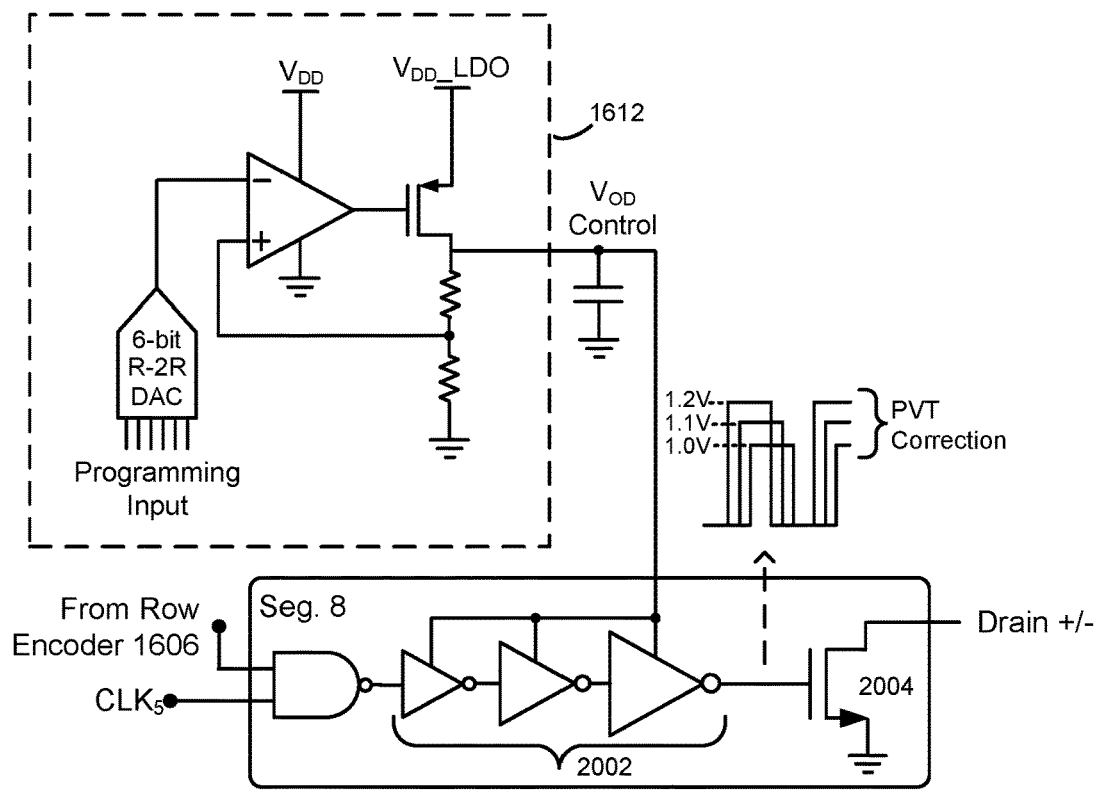
FIG. 20 is a drawing that illustrates how the programmable low-dropout (LDO) regulator of the DPA depicted in FIG. 16 is used to influence the overdrive voltage to a FET in one PA segment of the DPA and thereby correct for process, voltage, temperature (PVT), frequency and/or load impedance variations.
Figure 21:
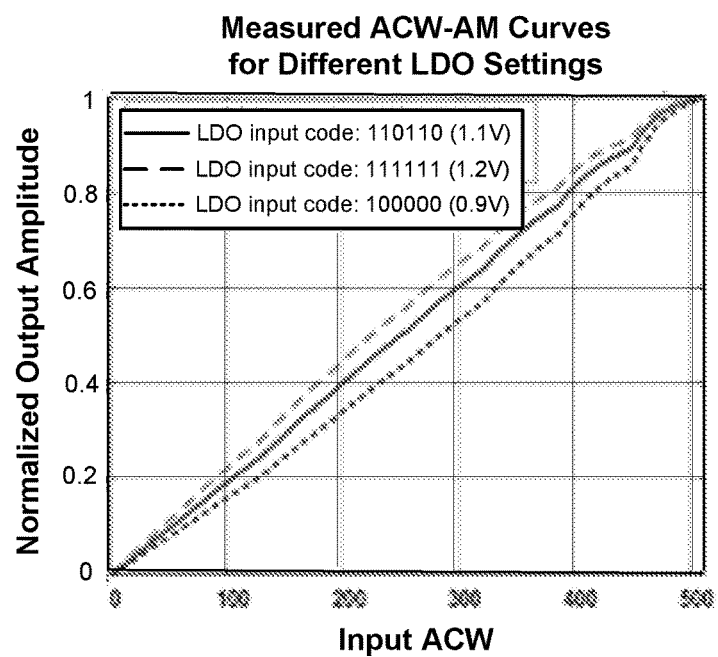
FIG. 21 is a graph showing how the overdrive voltage control provided by the LDO regulator in the DPA depicted in FIG. 16 is effective at correcting for nonlinearities caused by PVT/load/frequency variations, when the LDO regulator is programmed with three different input programming codes.

Finally, the DPA 1600 includes a LDO regulator 1612, which serves the same purpose as the LDO regulator 814 used in the DPA 800 depicted in FIG. 8, i.e., to fine tune the output amplitude and/or compensate for PVT/load/frequency variations. The LDO regulator 1612 in this particular embodiment is a 6-bit digitally programmable LDO regulator, which provides the ability to digitally tune the over-drive voltages to the RF-DAC's FETs. FIG. 20 further illustrates how the LDO regulator 1612 is used to vary the power supply voltage applied to an input buffer 2002 of one particular FET 2004 in a PA segment of the DPA 1600, specifically PA Seg. 8, and thereby influence the overdrive voltage VOD to the FET 2004, and FIG. 21 is a graph that shows how the overdrive voltage control aspect of the present invention is effective at altering the ACW-AM curves of the DPA 1600 and compensating for PVT and load impedance variations, for three different LDO input programming codes, 110110, 111111, and 100000. As was explained above, since RDS,eff(ON) depends on both Weff and VOD, so by varying these two parameters linearity can be optimized. (Note that while FIG. 20 only shows the overdrive voltage VOD being applied to one of the input buffers to one of the FETs in PA Seg. 8, the overdrive voltage VOD is actually applied to all input buffers of all FETs in the array. In other embodiments of the invention (see, for example, FIGS. 26 and 27 (discussed below)), a plurality of LDOs is used to provide independent overdrive voltage control for the various PA segments in the RF-DAC.)

Figure 22:
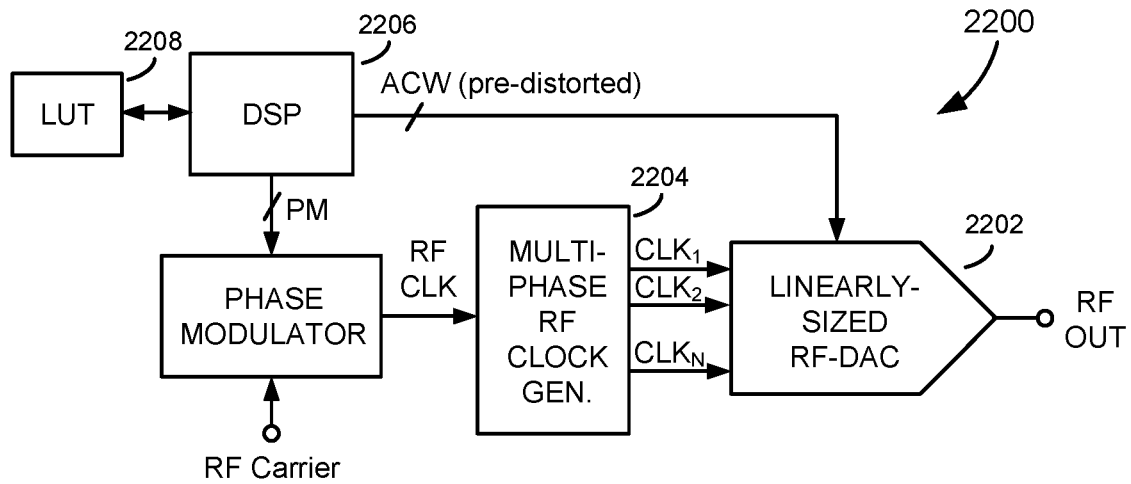
FIG. 22 is a drawing that depicts a DPA, according to another embodiment of the present invention, in which a multiphase RF clock generator is used to correct for ACW-PM distortion and digital predistortion (DPD) is used to correct for ACW-AM distortion resulting from the DPA's use of a linearly-sized RF-DAC.
Figure 23:
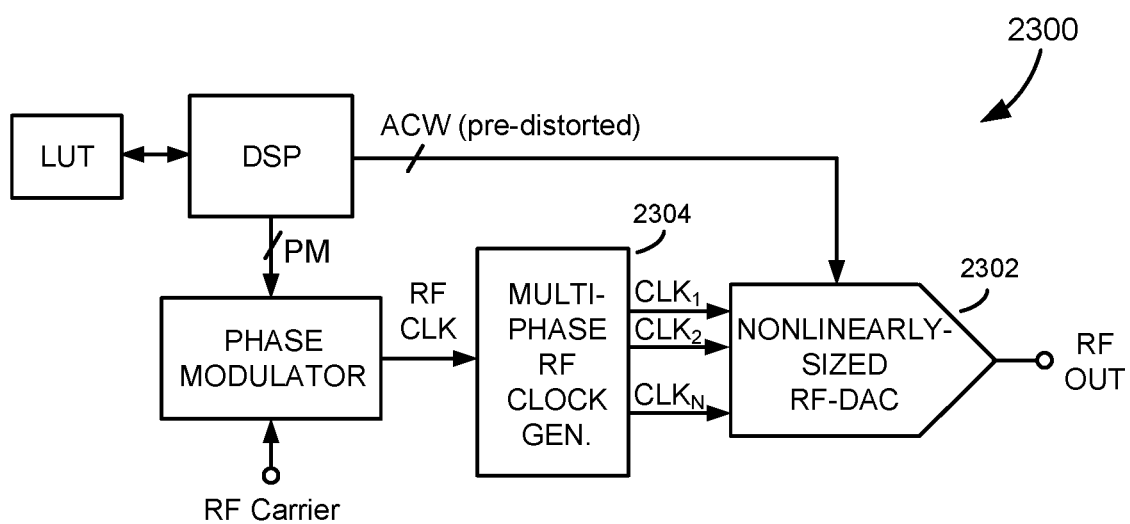
FIG. 23 is a drawing that depicts a DPA, according to another embodiment of the present invention, in which a multiphase RF clock generator is used to correct for ACW-PM distortion and a nonlinearly-sized RF-DAC is used to augment ACW-AM DPD and correct for ACW-AM distortion.

In all of the various DPAs of the present invention described above, a nonlinearly-sized RF-DAC is used to linearize the ACW-AM responses and multiphase RF clocking is used to reduce ACW-PM distortion. In other embodiments of the invention, one of those two aspects of the invention is used with DPD or either or both aspects are augmented by DPD to correct for either (or both) AM-AM and/or AM-PM distortion. For example, FIG. 22 depicts a DPA 2200 according to an embodiment of the invention that employs a multiphase RF clock generator 2204 to correct for ACW-PM distortion, but which employs a linearly-sized RF-DAC 2202, and FIG. 23 depicts a DPA 2300 according to an embodiment of the invention that augments ACW-AM DPD by the intrinsic ACW-AM linearization capability provided by a nonlinearly-sized RF-DAC 2302 (which, by the way, can be implemented in any of the various ways described above). Since the RF-DAC 2202 in the DPA 2200 is linearly-sized and consequently is incapable by itself of linearizing the ACW-AM profile of the DPA 2200, ACW-AM DPD is used to correct for ACW dependent AM distortion. (In this exemplary embodiment the ACW-AM DPD is performed using a DSP 2206 and LUT 2208 populated with ACW-AM predistortion coefficients. In an alternative embodiment the DSP 2206 is configured to perform ACW-AM DPD by calculating the ACW-AM predistortion coefficients on-the-fly based on a mathematical model.) An advantage offered by the DPA 2300 depicted in FIG. 23 is that the intrinsic ACW-AM correction provided by the nonlinearly-sized RF-DAC 2302 can relax the requirements of the augmenting ACW-AM DPD. (It should be noted that whereas the DPA 2300 addresses ACW-PM distortion using a multiphase RF clock generator 2304, ACW-PM DPD could be used, instead, or ACW-PM DPD could be used to augment the ACW-PM correction already provided by the multiphase RF clock generator 2304.)

Figure 24:
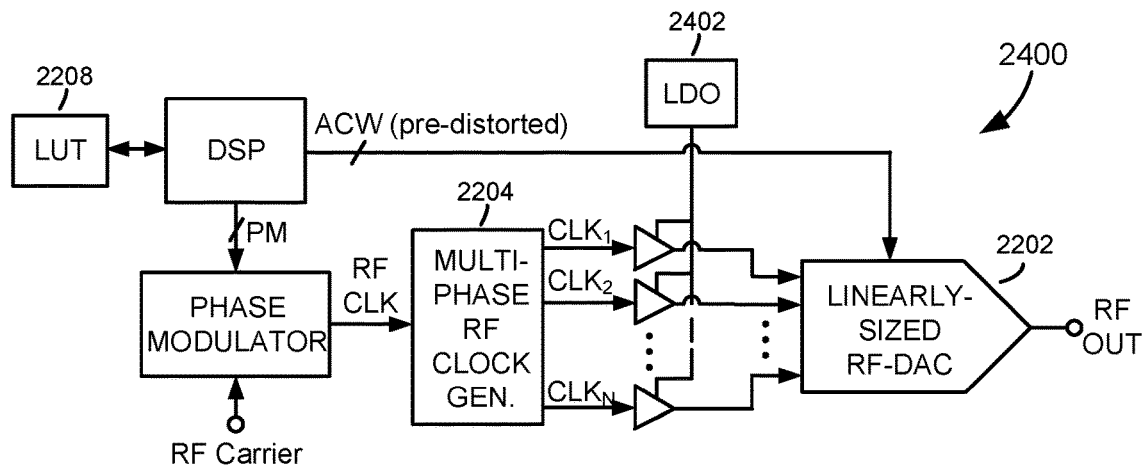
FIG. 24 is a drawing that depicts a DPA, according to another embodiment of the invention, that employs a multiphase RF clock generator to correct for ACW-PM distortion, a linearly-sized RF-DAC (e.g., an RF-DAC with linearly-weighted PA segments), and overdrive voltage control to compensate for process, voltage, temperature, load and/or frequency variations.
Figure 25:
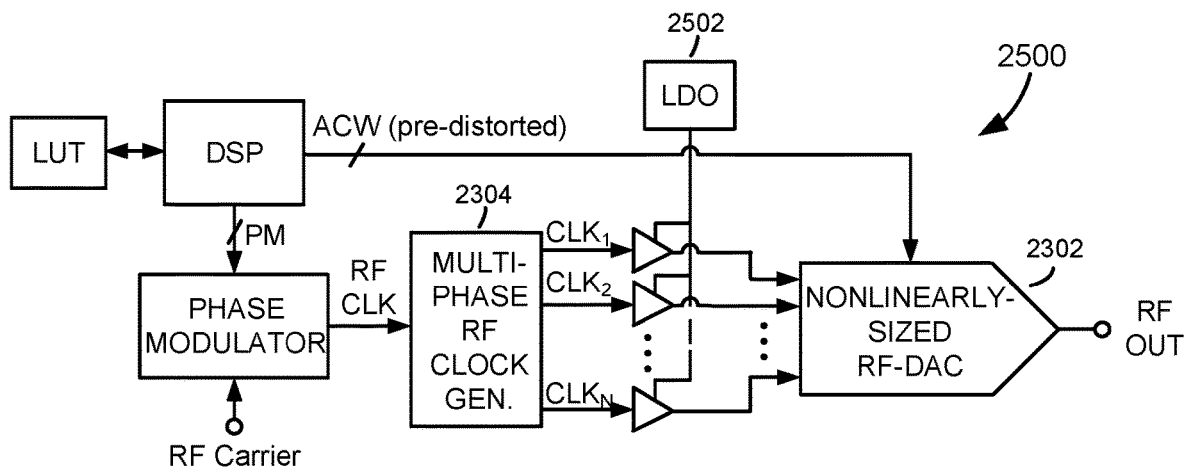
FIG. 25 is a drawing that depicts a DPA, according to another embodiment of the present invention, that employs a multiphase RF clock generator to correct for ACW-PM distortion, a nonlinearly-sized RF-DAC, digital AM-AM predistortion to augment the intrinsic AM-AM correction provided by the nonlinearly-sized RF-DAC, and overdrive voltage control to compensate for process, voltage, temperature, load and/or frequency variations.

FIG. 24 depicts a DPA 2400 according to yet another embodiment of the invention. In this exemplary DPA 2400 an LDO 2402 is used in conjunction with ACW-AM DPD to linearize the ACW-AM characteristics of a linearly-sized RF-DAC 2202. Similar to as the LDOs 814 and 1612 in the DPAs 800 and 1600 described above in reference to FIGS. 8 and 16, the LDO 2402 in the DPA 2400 serves to provide overdrive voltage control for FETs in the linearly-sized RF-DAC 2202 and thereby correct for process, voltage, temperature, load and/or frequency variations. The LDO 2402 also beneficially assists in the linearization without having to reprogram the LUT 2208 for each change in process, voltage, temperature, load and/or frequency. This overdrive voltage control can also be used to help linearize the ACW-AM response of a DPA that employs a nonlinearly-size RF-DAC and also without having to update the LUT for each change in process, voltage, temperature, load and/or frequency, such as in the DPA 2500 depicted in FIG. 25. (Note that ACW-PM correction in the DPAs 2400 and 2500 may be facilitated using the multiphase RF clocking aspect of the invention (as depicted in FIGS. 24 and 25), may be performed using DPD, or may be performed using a combination of the multiphase RF clocking aspect of the invention and DPD.)

Figure 26:
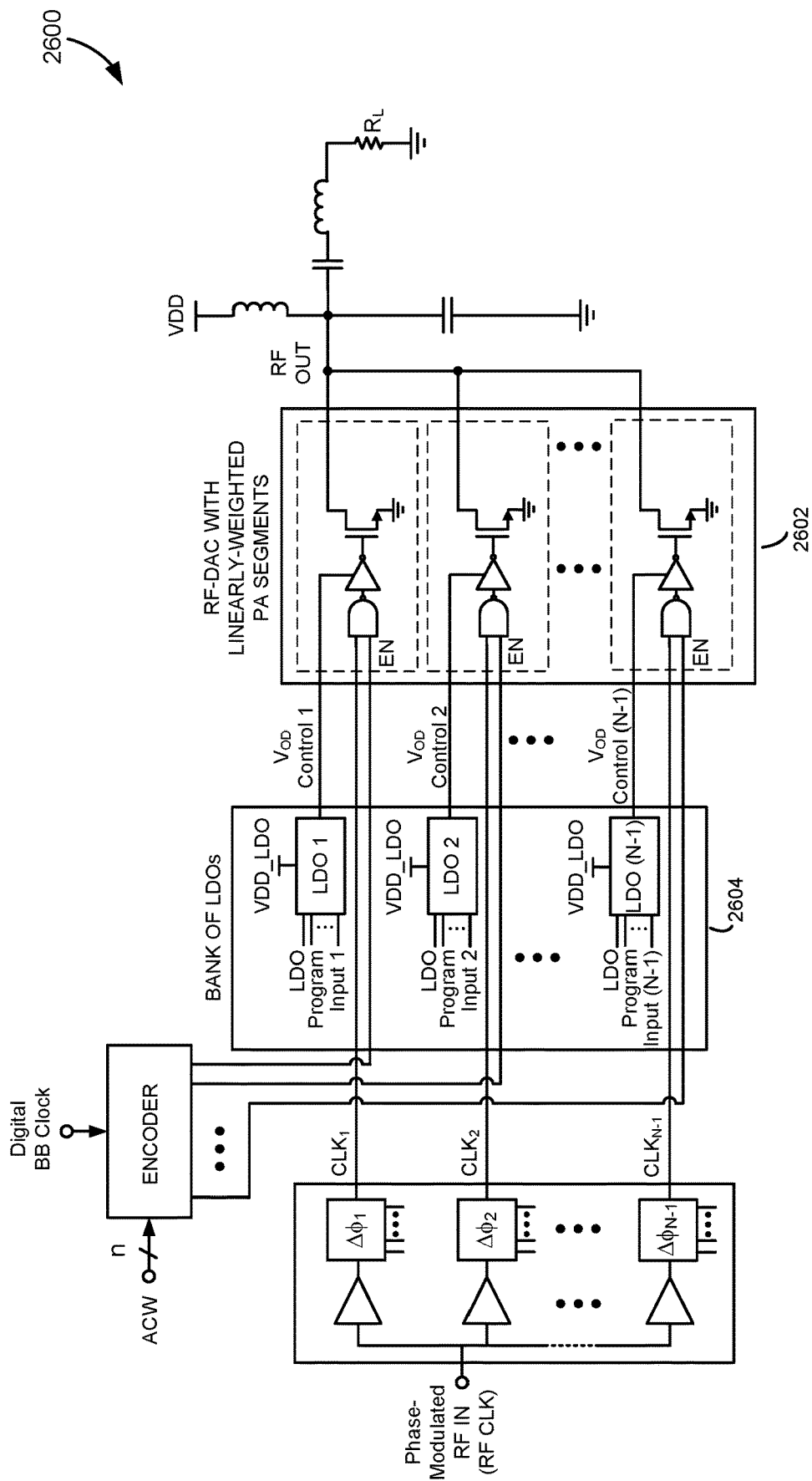
FIG. 26 is a drawing that depicts a DPA, according to another embodiment of the present invention, that employs an RF-DAC with linearly-weighted PA segments and a bank of LDOs that serves to facilitate linearization of the ACW-AM characteristics of the RF-DAC by providing independent overdrive voltage control to the FETs in each of the PA segments.
Figure 27:
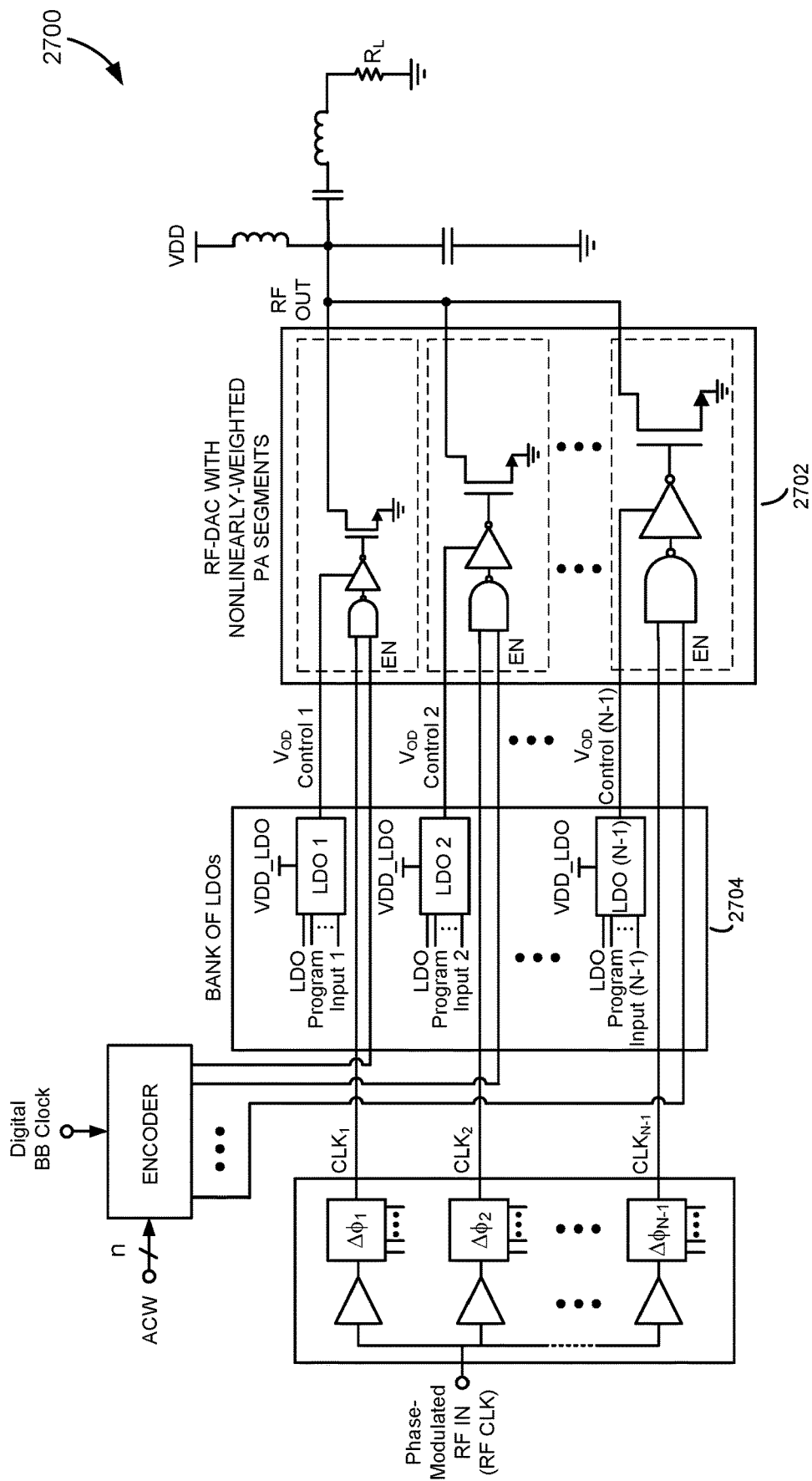
FIG. 27 is a drawing that depicts a DPA, according to another embodiment of the present invention, that employs an RF-DAC with nonlinearly-weighted PA segments and a bank of LDOs that serves to facilitate linearization of the ACW-AM characteristics of the RF-DAC by providing independent overdrive voltage control to the FETs in each of the PA segments.

FIG. 26 is a drawing that depicts a DPA 2600, according to another embodiment of the present invention. The DPA 2600 includes a linearly-weighted RF-DAC 2602 and a bank of LDOs 2604. Each LDO in the bank of LDOs 2604 provides independent overdrive voltage control for the FETs in an associated PA segment, and collectively the bank of LDOs 2604 serves to linearize the ACW-AM characteristics of the DPA 2600. It should be mentioned that although FIG. 26 shows that each PA segment has its own dedicated LDO, that is not a necessary condition. For example, several of the PA segments could be configured to share one LDO and several other PA segments could be configured to share another LDO. It should also be mentioned that the ACW-AM linearization facilitated by the bank of LDOs 2604 could be supplemented by ACW-AM DPD and/or by the intrinsic ACW-AM linearization provided by a nonlinearly-weighted RF-DAC, such as in the DPA 2700 depicted in FIG. 27. Similar to the DPA 2600 depicted in FIG. 26, the DPA 2700 depicted in FIG. 27 includes a bank of LDOs 2704. Each LDO in the bank of LDOs 2704 provides independent overdrive voltage control to the FETs in an associated PA segment (or to the FETs in several PA segments), and collectively the bank of LDOs 2704 serves to linearize the ACW-AM characteristics of the DPA 2700. If desired, the intrinsic ACW-AM correction provided by the nonlinearly-sized RF-DAC 2702 and the ACW-AM linearization facilitated by the bank of LDOs 2704 can be further supplemented by ACW-AM DPD. (Note that ACW-PM correction in the DPAs 2600 and 2700 may be facilitated by using the multiphase RF clocking aspect of the invention (as illustrated in FIGS. 26 and 27), by using ACW-PM DPD, or by using a combination of multiphase RF clocking and ACW-PM DPD.)

Figure 28:
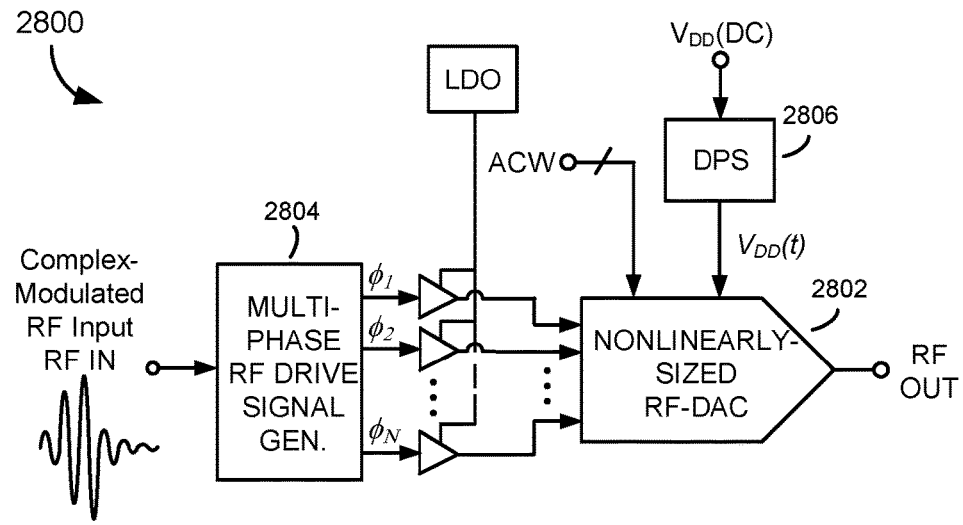
FIG. 28 is a drawing that depicts an envelope tracking (ET) DPA, in accordance with another embodiment of the present invention, that exploits both the intrinsic ACW-AM correction ability of the nonlinearly-sized RF-DAC and the ACW-PM correction facility afforded by the multiphase RF clock generator.

The RF-DACs in the various embodiments of the invention described above are configured to operate in switch-mode and the power transistors in the RF-DACs are driven by bi-level multiphase RF clocks CLK1, CLK2, ... CLKN provided by a multiphase RF clock generator. However, those are not necessary limitations, insofar as the scope of the invention is concerned. Nor is the use of a dynamic power supply (DPS) excluded. FIG. 28 illustrates, for example, how a nonlinearly-sized RF-DAC 2802 (implemented in any of the various ways described above) is used in an envelope tracking DPA (ET DPA) 2800, according to one embodiment of the invention. In this embodiment of the invention, the RF input to the ET DPA 2800 is amplitude modulated, i.e., the amplitude information is contained in the complex-modulated RF input signal RF IN and not separated from the PM as in the digital polar implementations described above, and a multiphase RF drive signal generator 2804 is used to produce and control the relative phase offsets of a plurality of RF drive signals, $\phi 1$, $\phi 2, \ldots, \phi N$, in order to reduce ACW-PM distortion in the RF output RF OUT of the ET PA 2800. (Note that the multiphase RF clock generators used in the previously described embodiments of the invention are also properly characterized as "multiphase RF drive signal generators." The word "clock" is used in the context of those embodiments of the invention, i.e., instead of the more general term "drive signal," in order to emphasize that the power transistors in those embodiments of the invention operate in switch-mode, rather than as controlled current sources, which is how the power transistors of the RF-DAC 2802 in the ET PA 2800 here operate.) The ET PA 2800 further includes a DPS 2806, which generates a DPS voltage VDD(t) for the power transistors in the nonlinearly-sized RF-DAC 2802. By tracking the envelope (i.e. the AM) in the complex-modulated RF input signal RF IN, the RF-DAC 2802 is able to operate at or near peak envelope power for all amplitude levels and is therefore capable of achieving high efficiency. An input ACW is used to enable/disable the RF-DAC's PA segments, depending on the amplitude of the complex-modulated RF input signal RF IN, and the intrinsic ACW-AM correction provided by the nonlinear-sizing of the PA segments in the RF-DAC 2802 results in a linearized ACW-AM output profile. It should be mentioned that in providing this ACW-AM correction, the input ACW can be made to either track the signal envelope (i.e., long-term average) of the input RF signal RF IN or could be made to track the instantaneous amplitude of the input RF signal RF IN. It should also be mentioned that although the complex modulated input RF signal RF IN is shown in FIG. 28 as being represented in the analog domain, those of ordinary skill in the art will appreciate and understand that it could be alternatively represented in the digital domain. This is also true, by the way, with the exemplary embodiments of the invention described in FIGS. 29 and 30 below.

Figure 29:
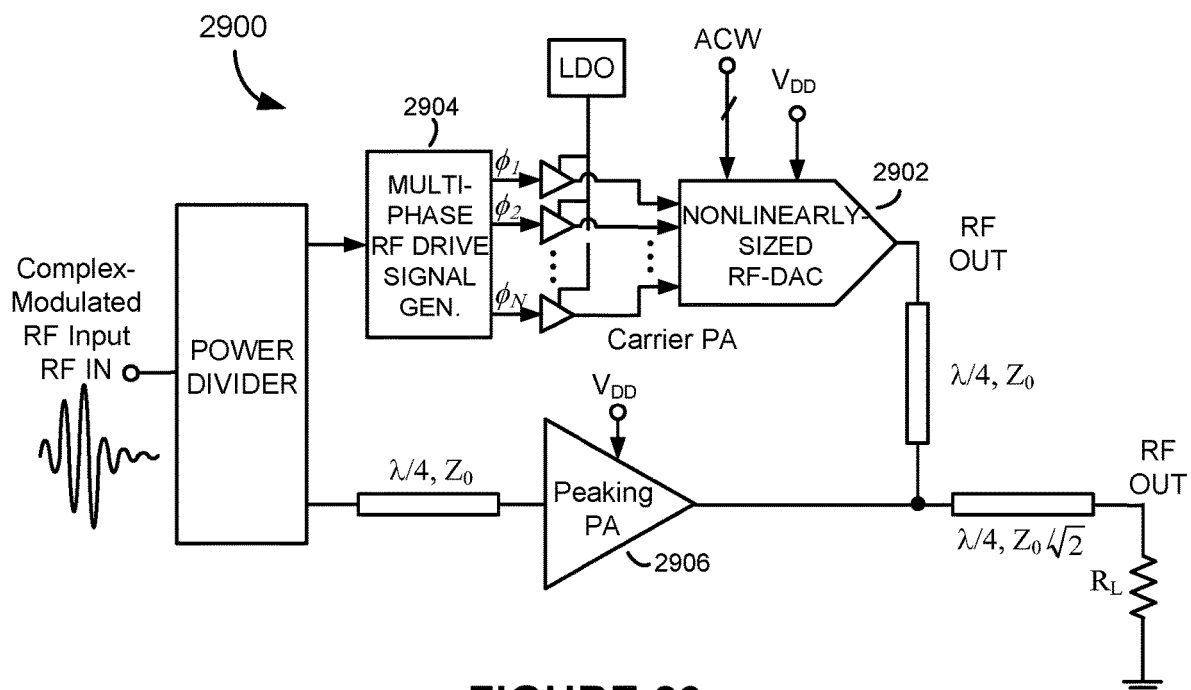
FIG. 29 is a drawing that depicts a Doherty PA, in accordance with another embodiment of the present invention, in which a nonlinearly-sized RF-DAC Used to implement the carrier PA and thereby intrinsically linearize the ACW-AM response of the carrier PA and a multiphase RF drive signal generator is used to reduce phase error at the output of the carrier PA.
Figure 30:
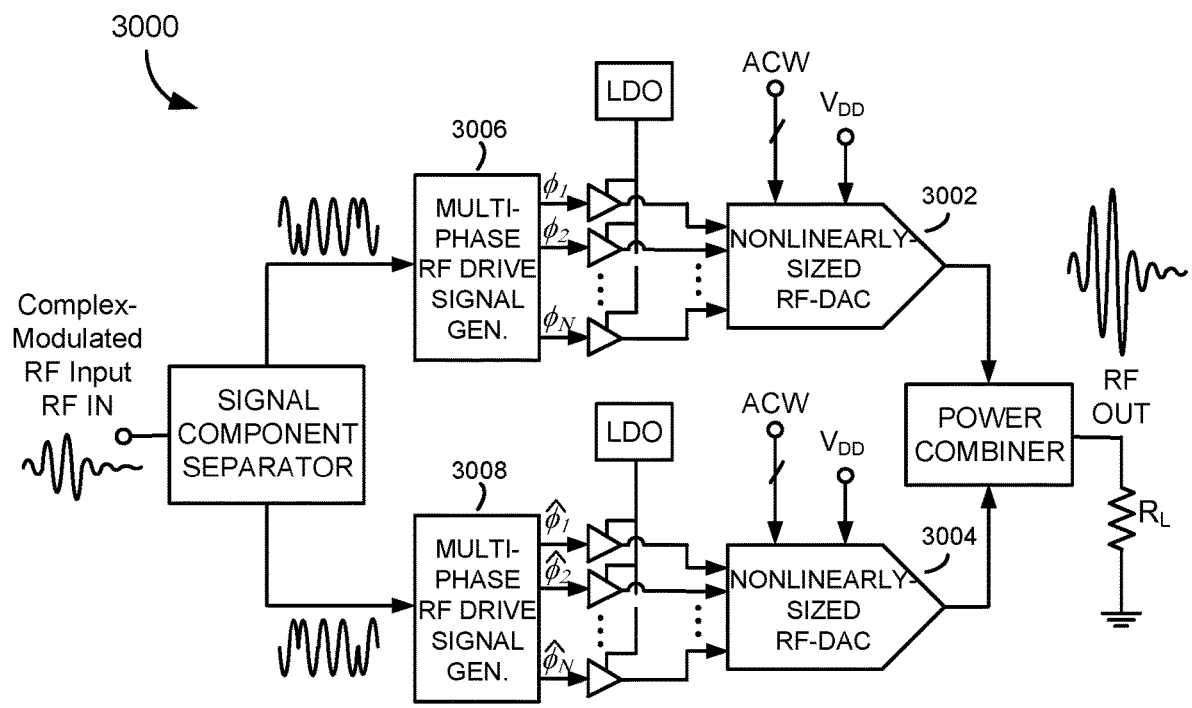
FIG. 30 is a drawing the depicts an outphasing PA, in accordance with another embodiment of the present invention, in which the PA in each branch is implemented using a nonlinearly-sized RF-DAC and each branch includes a multiphase RF drive signal generator to help minimize phase error at the terminus of each branch.

The intrinsic ACW-AM correction provided by the nonlinear-sized RF-DAC 2802 and the ACW-PM correction realized by use of the multiphase RF drive signal generator 2804 are beneficially combined with ET DPA's 2800's efficiency enhancing capability to provide a highly linear and highly efficient PA solution. Either or both of these aspects of the present invention can be incorporated in other types of efficiency enhancing PAs to correct for or substantially reduce AM-AM and AM-PM distortion. FIG. 29 illustrates, for example, how a nonlinearly-sized RF-DAC 2902 is used to implement the carrier PA in a Doherty PA 2900 and how the carrier PA 2902 is driven by a multi-phase RF drive signal generator 2904 to minimize phase error at the carrier PA output. (Note that although not shown in FIG. 29, the peaking PA 2906 could also be (or alternatively) implemented using a nonlinearly-sized RF-DAC and/or include a multi-phase RF signal generator.) And, FIG. 30 illustrates how both branches in an outphasing PA 3000 are configured to include nonlinearly-sized RF-DACs 3002 and 3004 and multi-phase RF drive signal generators 3006 and 3008, to compensate for or substantially prevent AM-AM and AM-PM distortion. As is understood by those of ordinary skill in the amplifier arts, the Doherty PA and outphasing PA both exploit a technique known as "load pulling" to increase their efficiencies at backed-off output power levels. Further details concerning the operations of the conventional Doherty PA and conventional outphasing PA, including how those types of PAs use load pulling to enhance their efficiencies, may be found in Chapter 2 of "Cripps, S. C., "Advanced Techniques in RF Power Amplifier Design," 1st edition, Artech House Publishers, pp. 33-72, 2002, which is incorporated herein by reference. By exploiting the intrinsic AM-AM correction provided by the nonlinearly-sized RF-DACs of the present invention and the AM-PM distortion reduction facilitated by the multiphase RF driver, AM-AM and AM-PM distortion in these other types of energy enhancing PAs can be substantially avoided and without having to rely solely on DPD.

Finally, it should be mentioned that the intrinsic AM-AM correction provided by the nonlinearly-sized RF-DACs and/ or the ACW-PM correction facilitated by the multiphase RF drive signal generators can be exploited in applications where the DPA's load changes over time, such as in MIMO applications and mobile handset applications where the antenna impedance changes over time. As was explained above, the effective ON resistance RDS,eff(ON) of the RF-DACs of the present invention is variable and dependent upon the input ACW. Additionally, the output phase of the DPA's RF output is influenced by the phase offsets of the multiphase RF drive signals produced by the multi-phase RF drive signal generators. Accordingly, in applications where AM-AM distortion occurs due to changes in load impedance, AM-AM distortion can be compensated for by using a LDO to tune the overdrive voltage produce by the FETs' input buffers (or by using multiple LDOs to control different overdrive voltages in different PA segments, similar to as described above in reference to FIGS. 26 and 27). AM-PM distortion due to changes in the load impedance can also be compensated for by appropriately adjusting the relative phase offsets among the multiphase RF drive signals.

While various embodiments of the present invention have been presented, they have been presented by way of example and not limitation. It will be apparent to persons skilled in the relevant art that various changes in form and detail may be made to the exemplary embodiments without departing from the true spirit and scope of the invention. Accordingly, the scope of the invention should not be limited by the specifics of the exemplary embodiments of the invention but, instead, should be determined by the appended claims, including the full scope of equivalents to which such claims are entitled.

The invention claimed is:

1. A digitally-controlled power amplifier (DPA), comprising:
    a radio frequency digital-to-analog converter (RF-DAC) comprising a plurality of nonlinearly-weighted PA segments, each PA segment including one or more power transistors;
    control logic configured to selectively and digitally enable and disable power transistors in the plurality of PA segments depending on a time-varying value of an input amplitude code word (ACW); and
    an RF drive signal generator configured to generate one or more RF drive signals that drive those power transistors in the PA segments that have been selectively and digitally enabled by the control logic,
    wherein the nonlinear weighting of the PA segments and the enabling and disabling of power transistors by the control logic are controlled in a manner that results in an amplitude of an RF output produced by the DPA being a substantially linear function of the input ACW.

2. The DPA according to claim 1, wherein the power transistors in each PA segment have the same size but the power transistors from one PA segment to another PA segment have different sizes that are not linearly related.

3. The DPA according to claim 1, wherein each PA segment includes power transistors of different sizes and the power transistors from one PA segment to another PA segment have different sizes that are not linearly related.

4. The DPA according to claim 1, wherein:
    the plurality of nonlinearly-weighted PA segments comprises a plurality of nonlinearly-sized field-effect transistors (FETs), and an effective gate width of the RF-DAC at any given time is determined by the sum of the gate widths of those FETs that have been selectively and digitally enabled by the control logic, and the control logic is configured to selectively and digitally enable and disable the power transistors in the plurality of PA segments in a manner that results in the effective gate width being a nonlinear function of the input ACW and the amplitude of the RF output produced by the DPA being a substantially linear function of the input ACW.

5. The DPA according to claim 4, further comprising:
a plurality of input buffers associated with the plurality of nonlinearly-sized FETs; and
a voltage regulator that controls a DC power supply voltage to the input buffers and overdrive voltages produced by the input buffers to reduce errors in the RF output caused by process, voltage, temperature, frequency and/or load variations.

6. The DPA according to claim 1, wherein the RF drive signal generator comprises a multiphase RF drive signal generator that generates a plurality of RF drive signals, and those power transistors that have been selectively and digitally enabled by the control logic are configured to be driven by the plurality of RF drive signals in a manner that reduces phase error in the RF output.

7. The DPA according to claim 6, wherein the multiphase RF drive signal generator comprises a multiphase RF clock generator configured to generate a plurality of multiphase RF clocks and the RF-DAC is configured to operate in a switch mode.

8. The DPA according to claim 6, further comprising a digital signal processor configured to digitally predistort phases of the plurality of RF drive signals and thereby augment ACW-PM distortion reduction facilitated by the multiphase RF drive signal generator.

9. The DPA according to claim 6, wherein the RF-DAC is a differential RF-DAC and includes a coupling capacitor coupled across its differential output, said coupling capacitor having a capacitance that helps reduce degradation of drain efficiency caused by skewing of the plurality of RF drive signals or by other non-idealities in electrical paths between outputs of the multiphase RF drive signal generator and inputs of the RF-DAC.

10. The DPA according to claim 1, wherein the RF-DAC is configured to operate as a controlled current source.

11. The DPA according to claim 1, wherein the RF-DAC is configured to serve in an envelope tracking PA.

12. The DPA according to claim 1, wherein the RF-DAC is configured to serve as a carrier PA or as a peaking PA in a Doherty amplifier.

13. The DPA according to claim 1, wherein the RF-DAC and a substantially similar second RF-DAC are configured to serve in first and second branches of an outphasing PA.

14. The DPA according to claim 1, further comprising a digital signal processor configured to augment the ACW-AM correction intrinsically provided by the RF-DAC with ACW-AM digital predistortion (DPD).

15. The DPA according to claim 1, further comprising a digital signal processor configured to digitally predistort a phase or phases of the one or more RF drive signals.

16. The DPA according to claim 1, wherein the RF-DAC is controlled to compensate for distortion caused by changes in the DPA's load impedance.

* * * * *